(12) United States Patent
Tessariol et al.

(10) Patent No.: US 11,700,732 B2
(45) Date of Patent: Jul. 11, 2023

(54) MEMORY DEVICE INCLUDING DIFFERENT DIELECTRIC STRUCTURES BETWEEN BLOCKS

(71) Applicant: Micron Technology, Inc., Boise, ID (US)

(72) Inventors: Paolo Tessariol, Montebelluna (IT); David H. Wells, Boise, ID (US); Umberto Maria Meotto, Rivoli (IT)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 17/146,193

(22) Filed: Jan. 11, 2021

(65) Prior Publication Data

US 2022/0223613 A1   Jul. 14, 2022

(51) Int. Cl.
*H01L 23/528* (2006.01)
*H10B 43/50* (2023.01)
(Continued)

(52) U.S. Cl.
CPC ......... *H10B 43/50* (2023.02); *H01L 23/5226* (2013.01); *H01L 23/5283* (2013.01);
(Continued)

(58) Field of Classification Search
CPC ......... H01L 27/11575; H01L 27/11548; H01L 27/11556; H01L 27/11582; H01L 27/11565; H01L 23/5336; H01L 23/5283; H01L 27/11524; H01L 27/1157; H01L 27/11529; H01L 27/11514; H01L 27/11551; H01L 27/11578; G11C 2213/75
See application file for complete search history.

(56) References Cited

U.S. PATENT DOCUMENTS

2019/0296034 A1*  9/2019  Nagashima ....... H01L 21/76224
2020/0091188 A1*  3/2020  Lee ..................... H01L 27/2454
(Continued)

FOREIGN PATENT DOCUMENTS

CN   114765182   7/2022

OTHER PUBLICATIONS

"Chinese Application Serial No. 202210028544.3, Response filed Apr. 6, 2022 to Notification to Make Rectification mailed Feb. 10, 2022", with English claims, 151 pages.

*Primary Examiner* — Galina G Yushina
(74) *Attorney, Agent, or Firm* — Schwegman Lundberg & Woessner, P.A.

(57) ABSTRACT

Some embodiments include apparatuses and methods of forming the apparatuses. One of the apparatuses includes levels of conductive materials interleaved with levels of dielectric materials; memory cell strings including respective pillars extending through the levels of conductive materials and the levels of dielectric materials; a first dielectric structure formed in a first slit through the levels of conductive materials and the levels of dielectric materials; a second dielectric structure formed in a second slit through the levels of conductive materials and the levels of dielectric materials; the first dielectric structure and the second dielectric structure separating the levels of conductive materials, the levels of dielectric materials, and the pillars into separate portions, and the first and second dielectric structures including different widths.

18 Claims, 26 Drawing Sheets

(51) Int. Cl.
    *H01L 23/522*     (2006.01)
    *H10B 41/27*     (2023.01)
    *H10B 41/50*     (2023.01)
    *H10B 43/27*     (2023.01)

(52) U.S. Cl.
    CPC ............. *H10B 41/27* (2023.02); *H10B 41/50* (2023.02); *H10B 43/27* (2023.02)

(56) References Cited

U.S. PATENT DOCUMENTS

2020/0105909 A1*   4/2020   Wu ..................... H01L 29/7843
2020/0321350 A1*  10/2020   Oike ................. H01L 27/11553

* cited by examiner

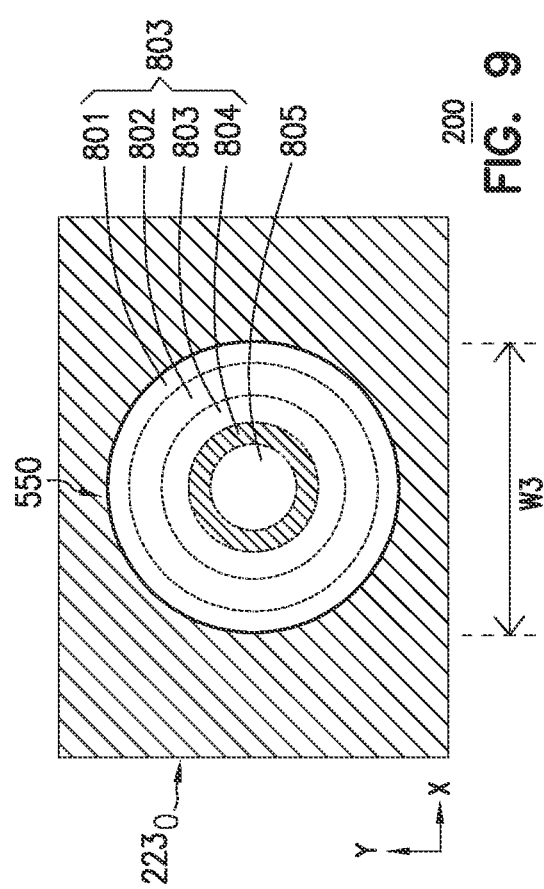

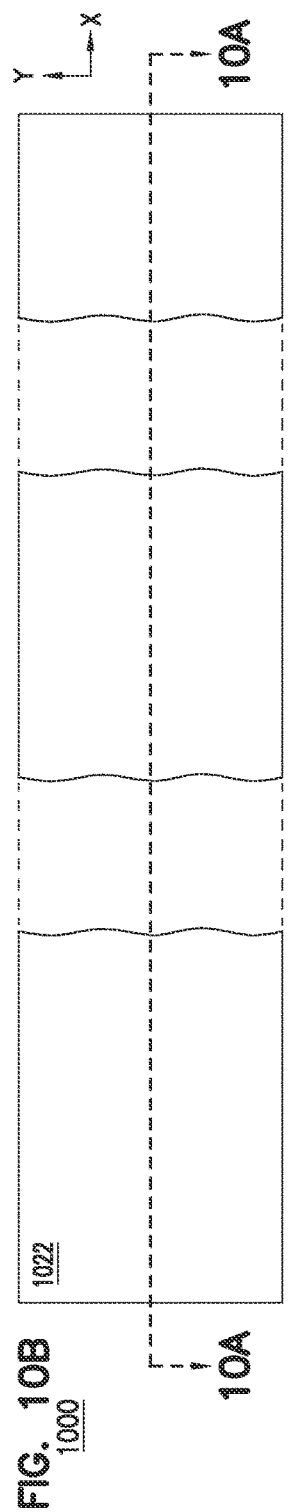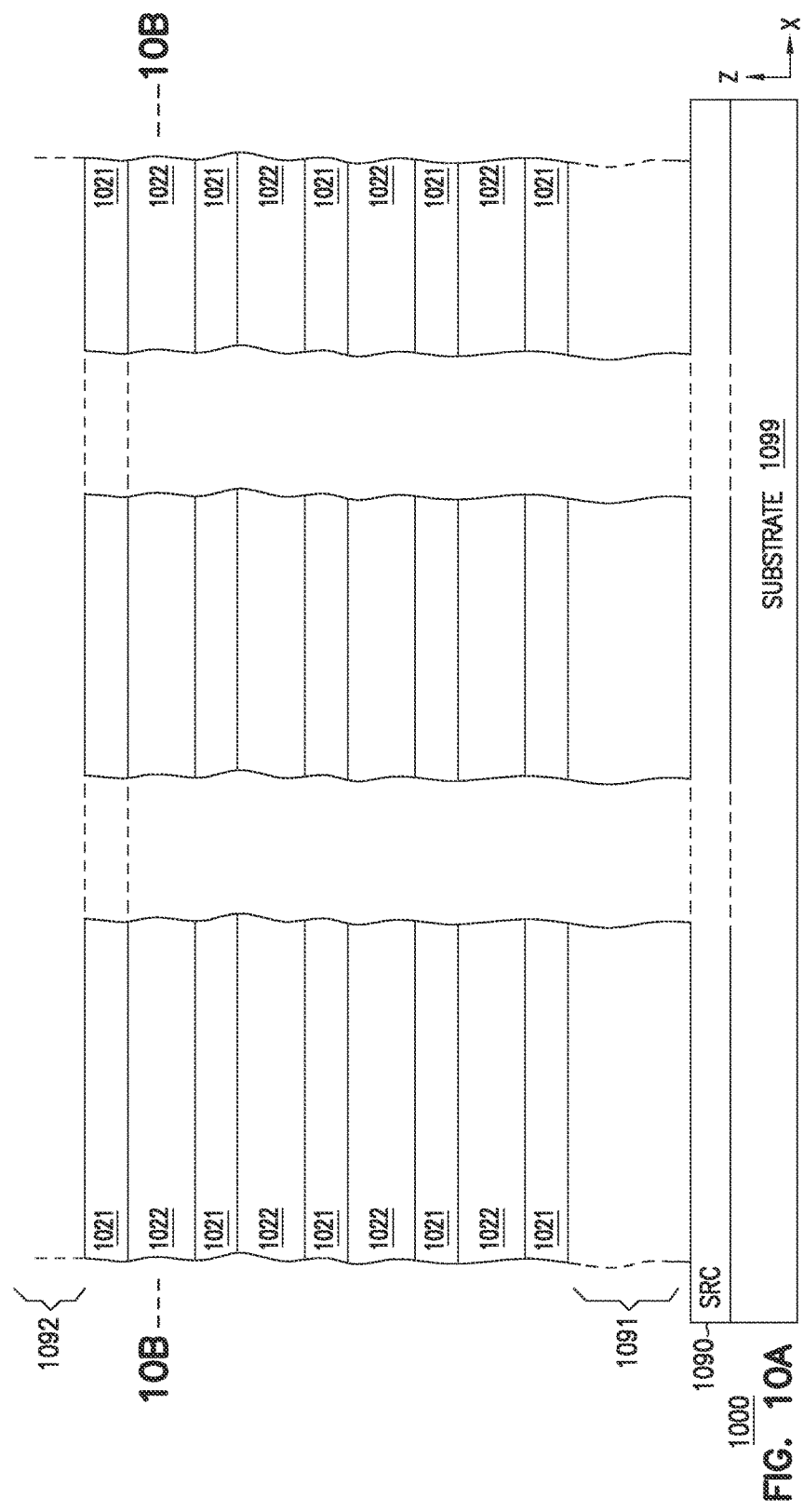

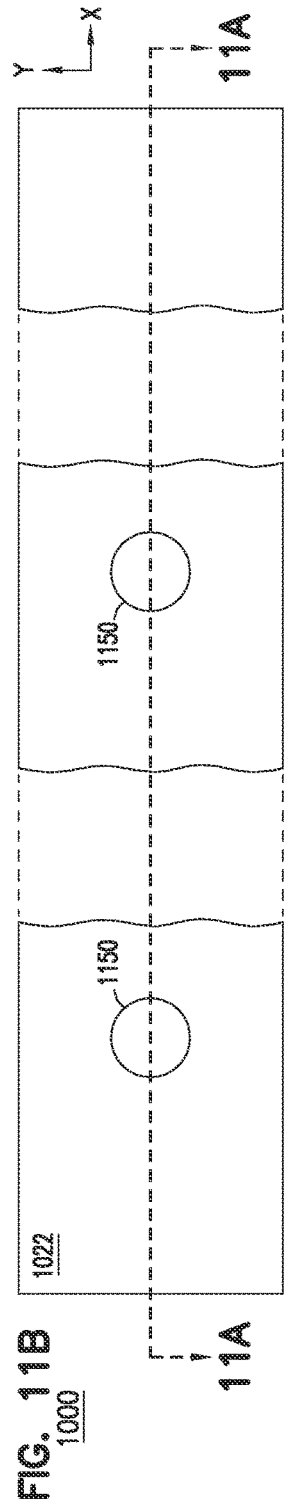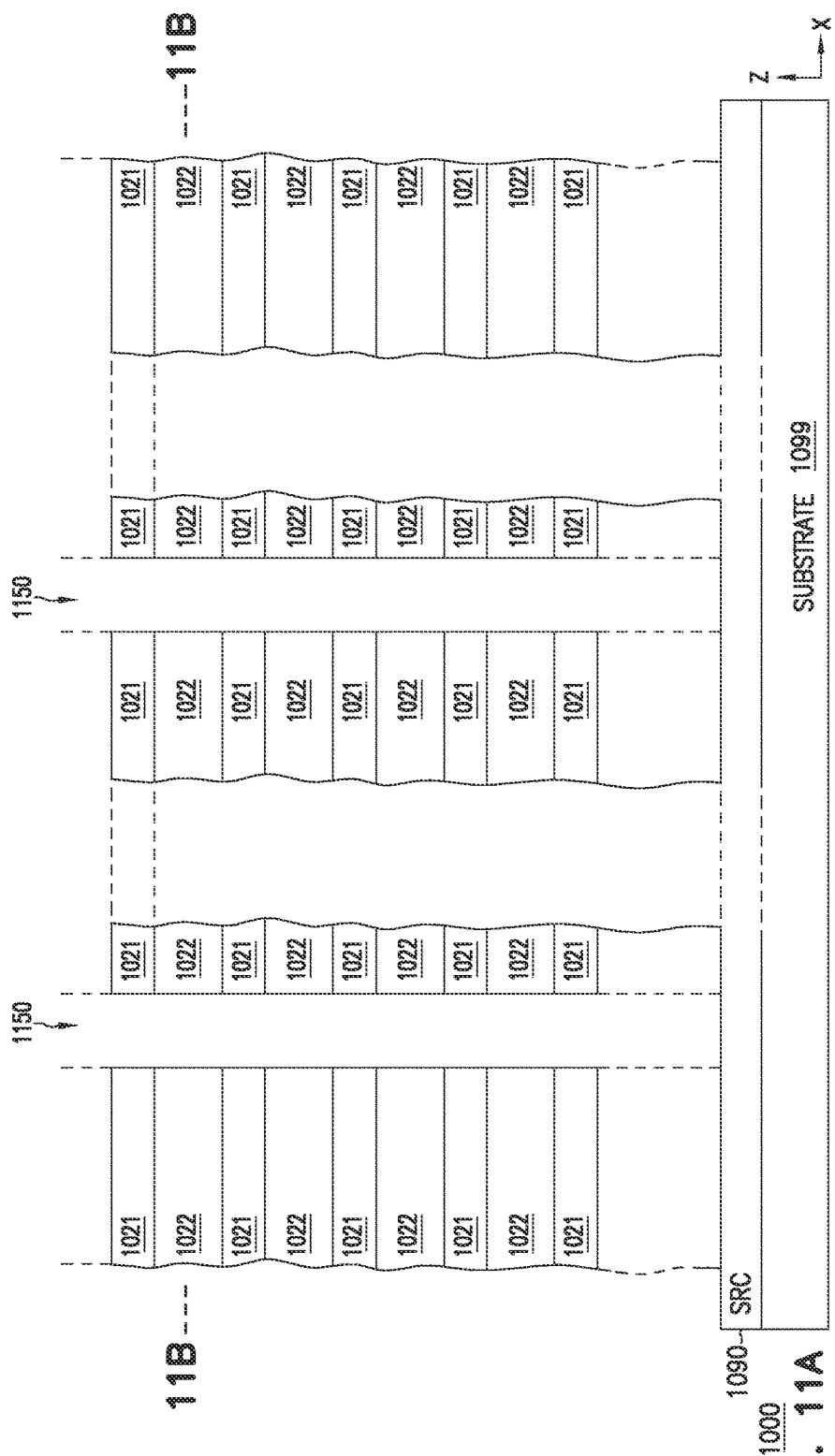

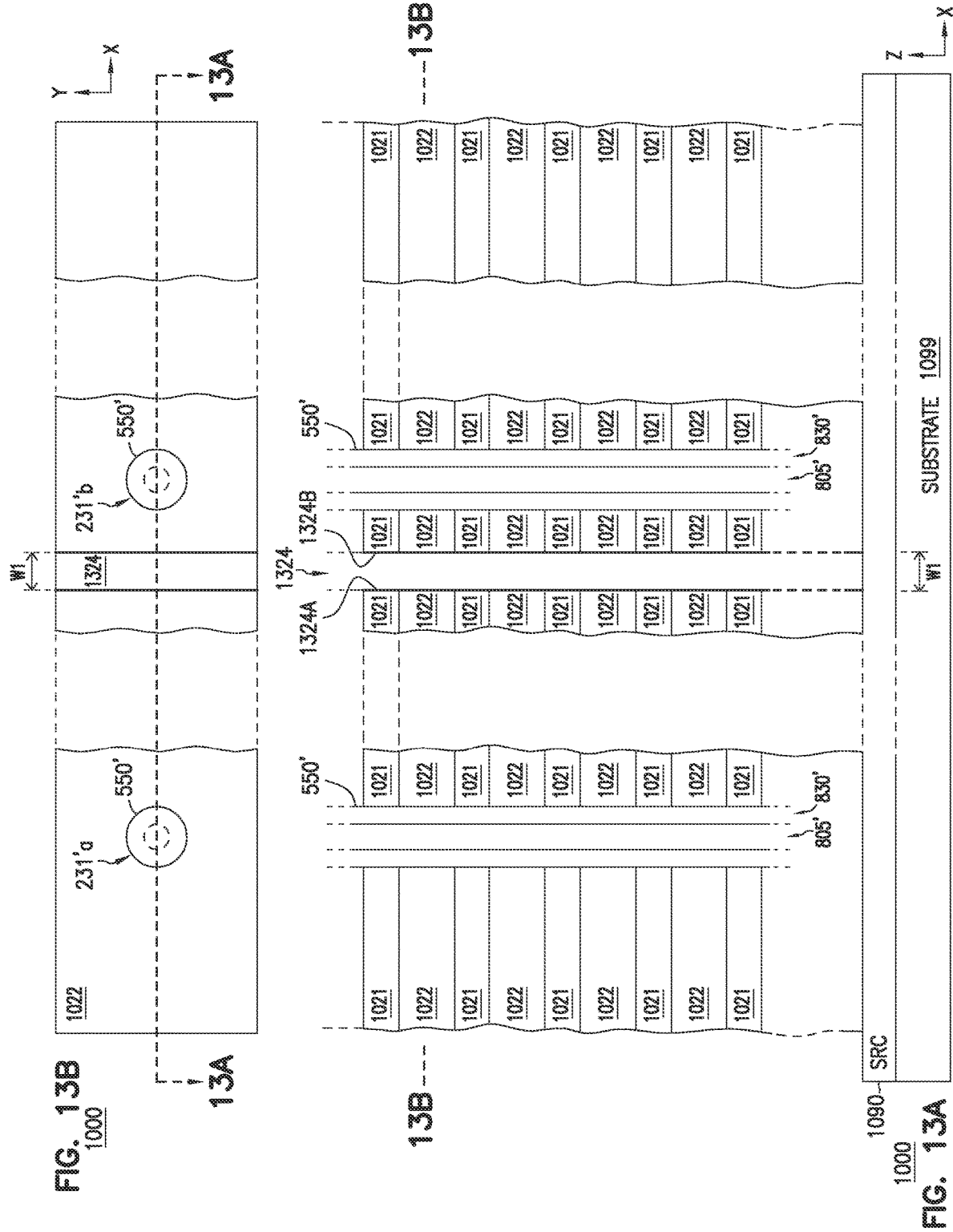

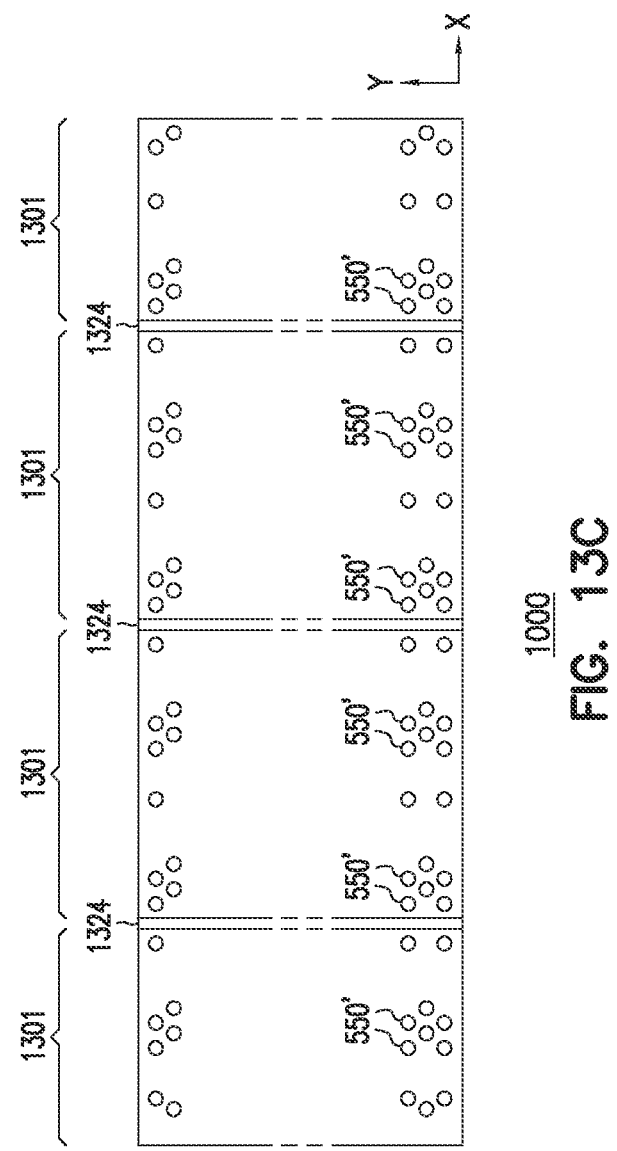

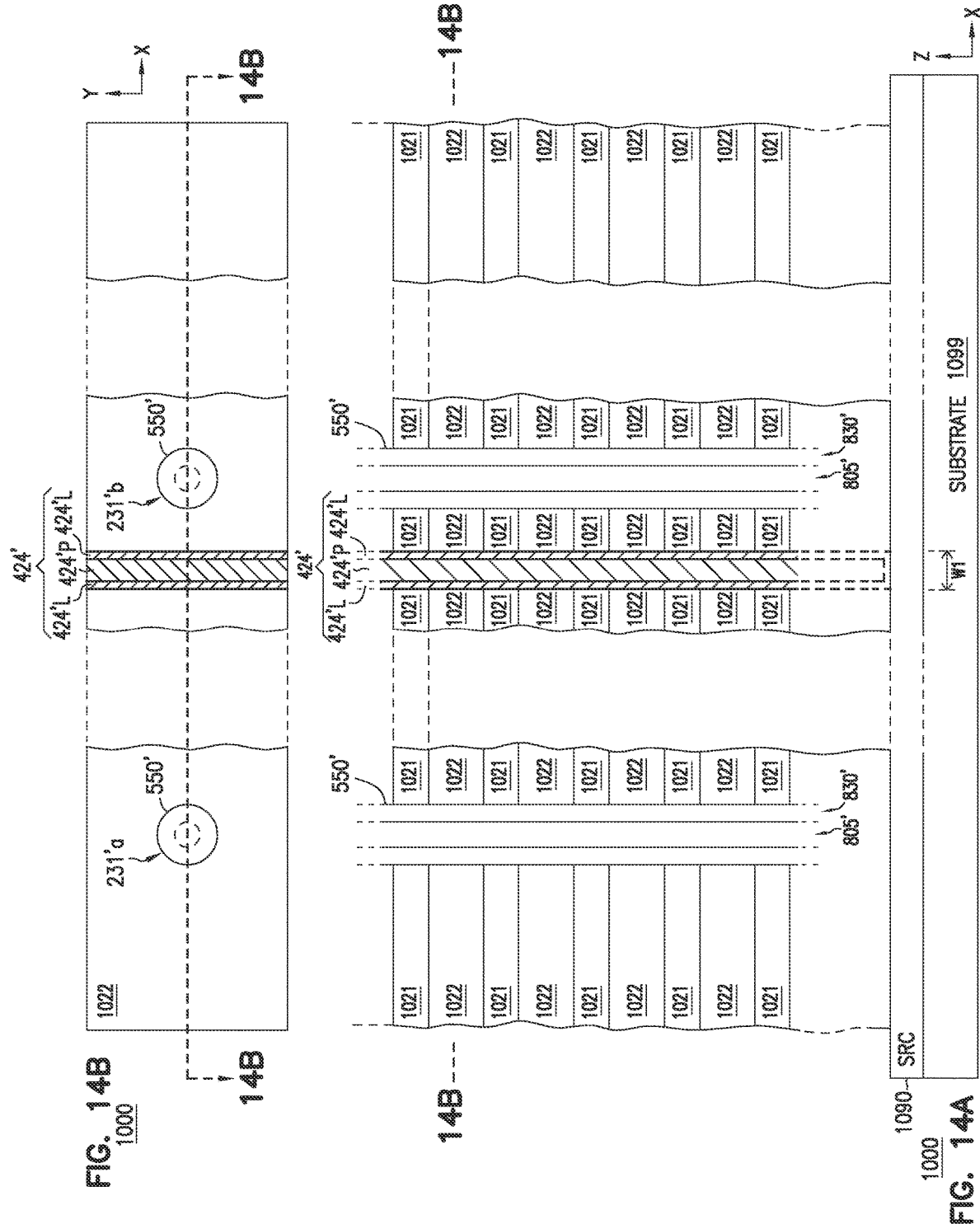

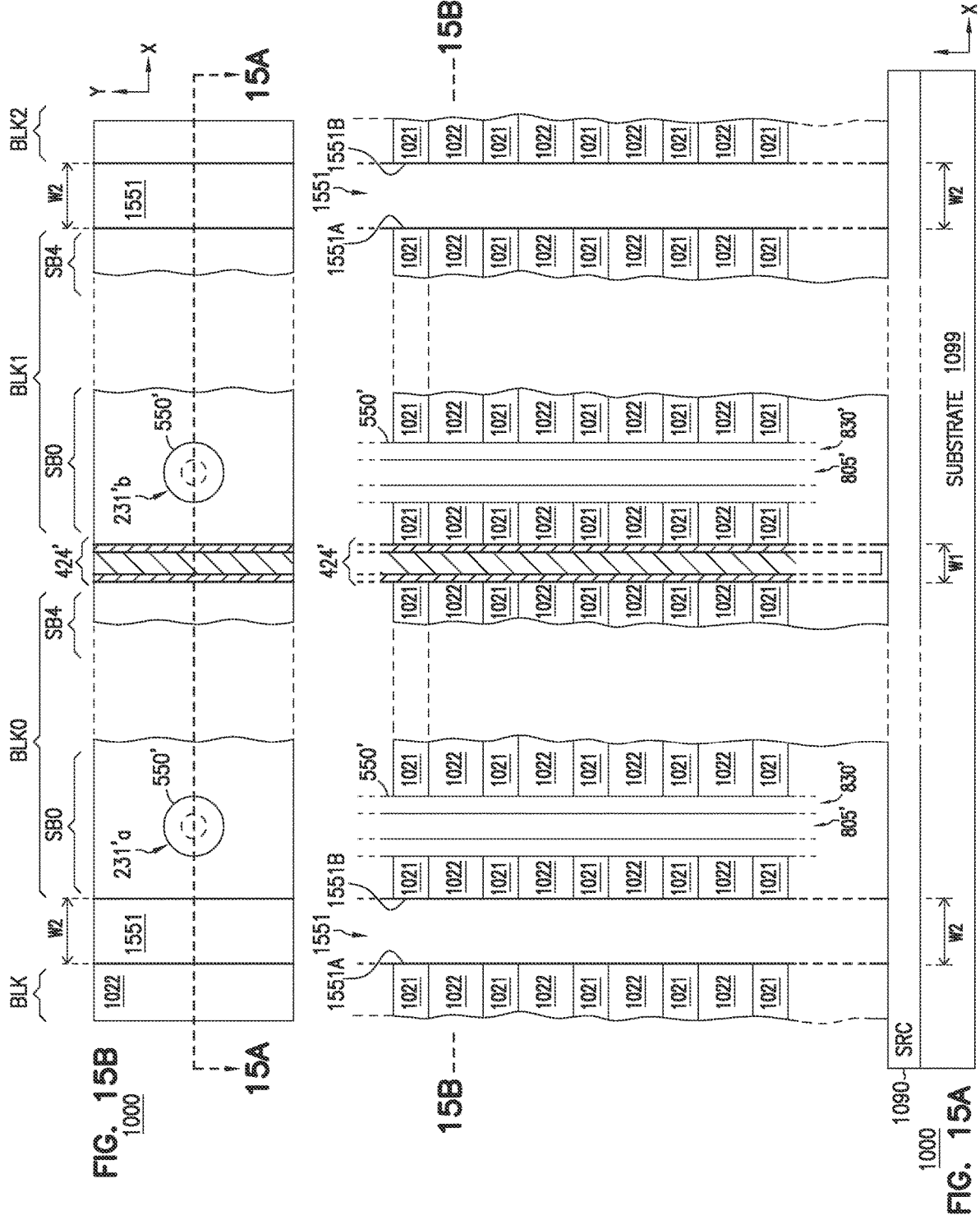

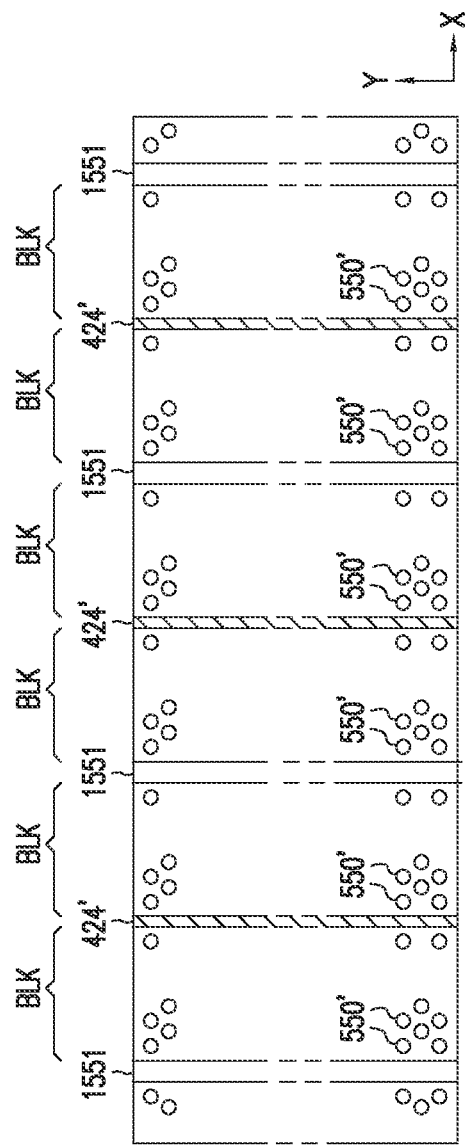

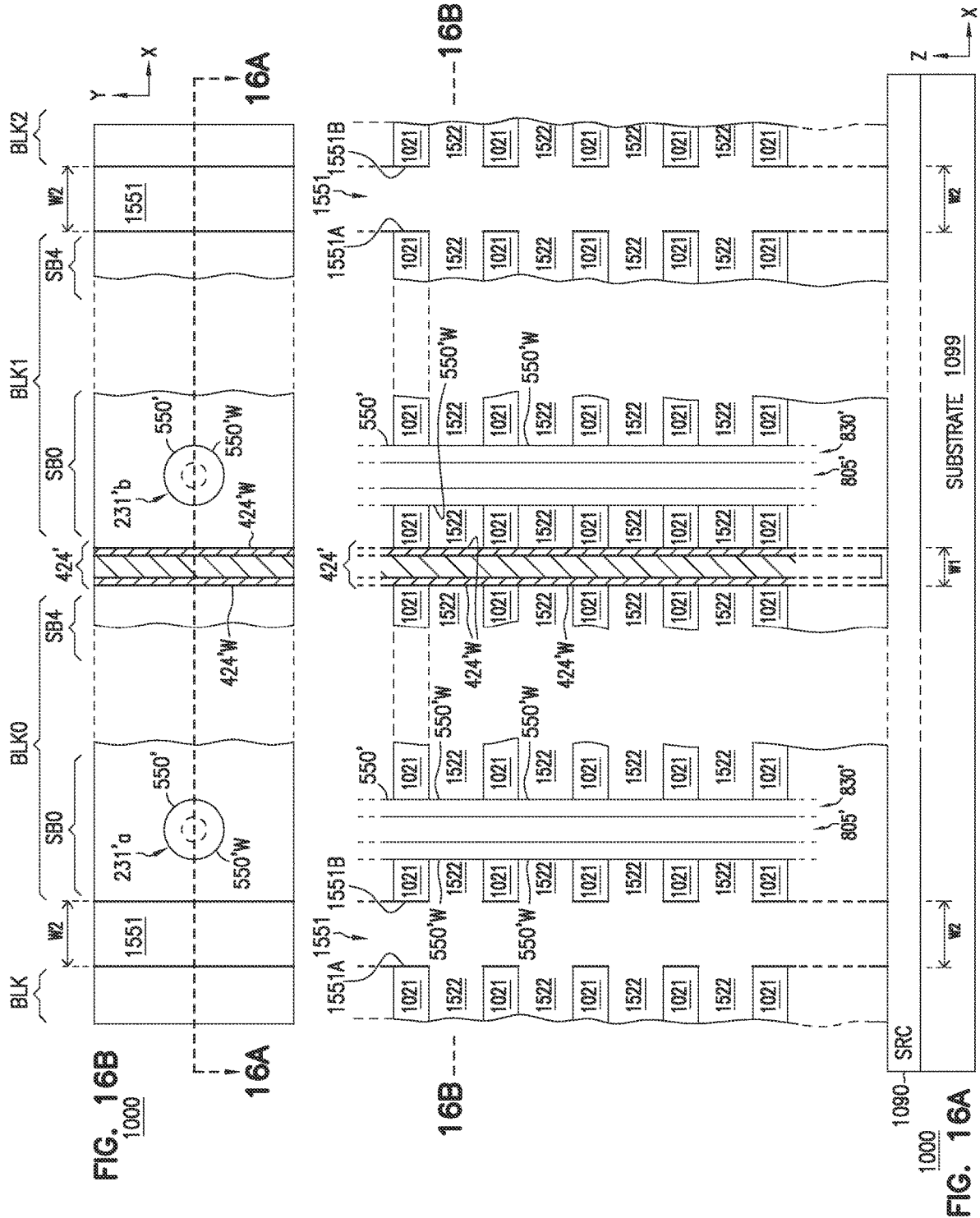

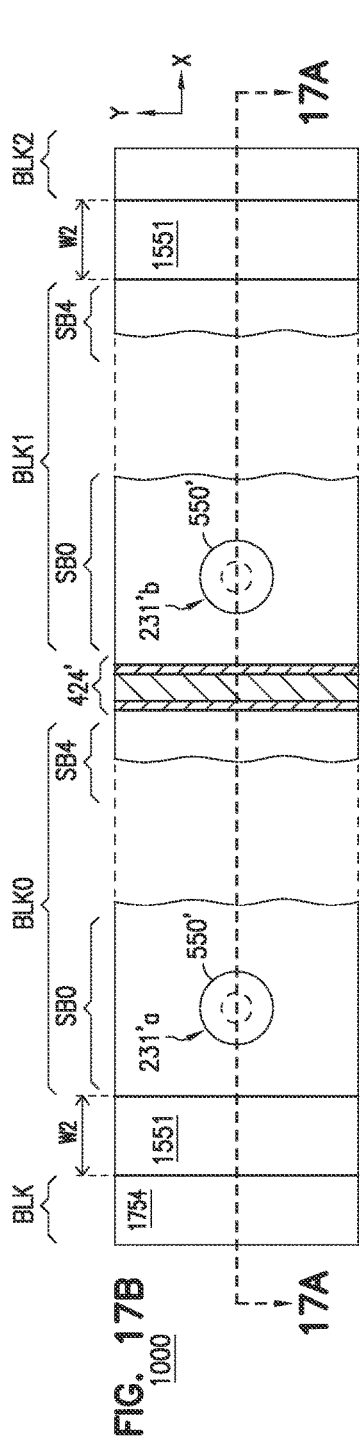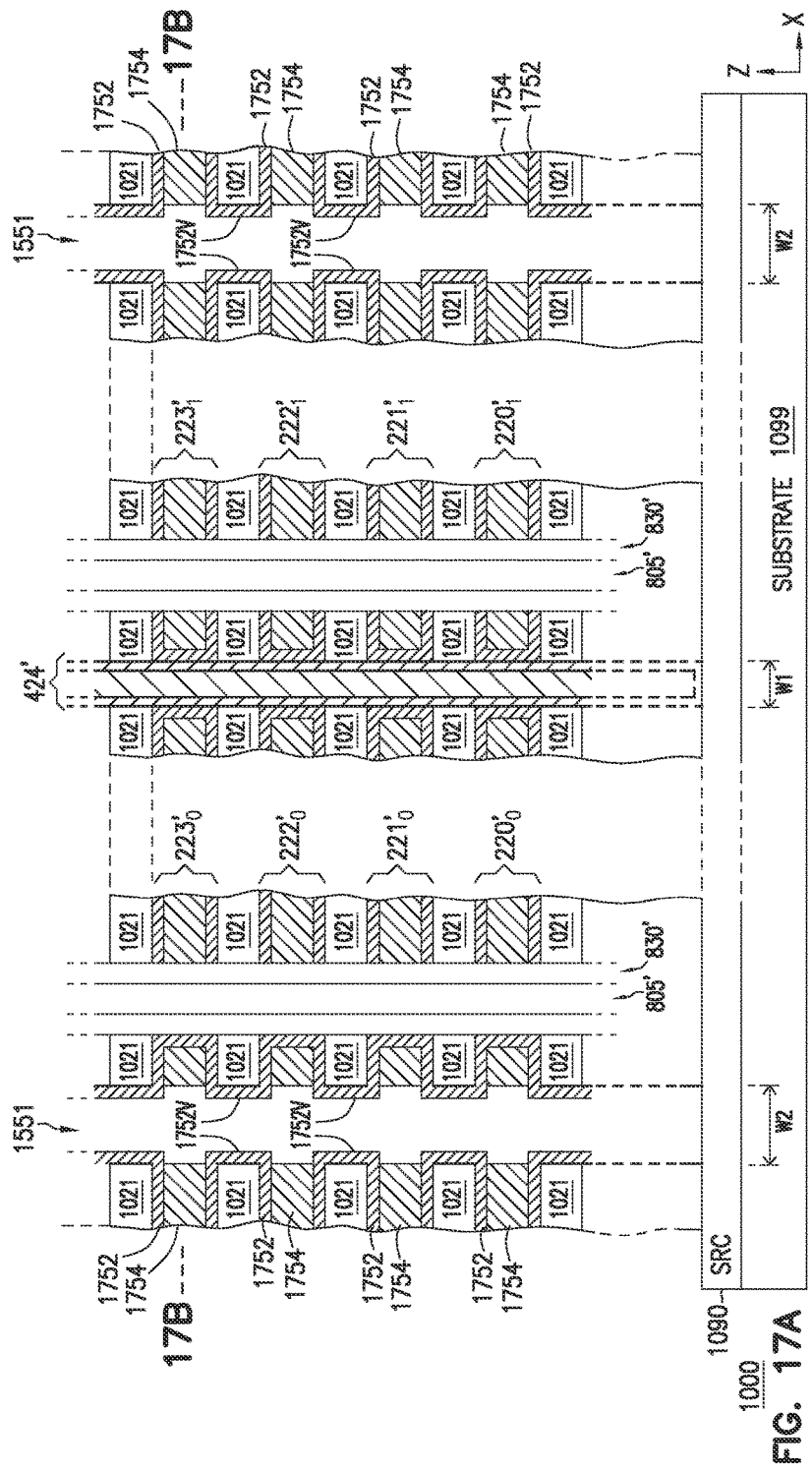

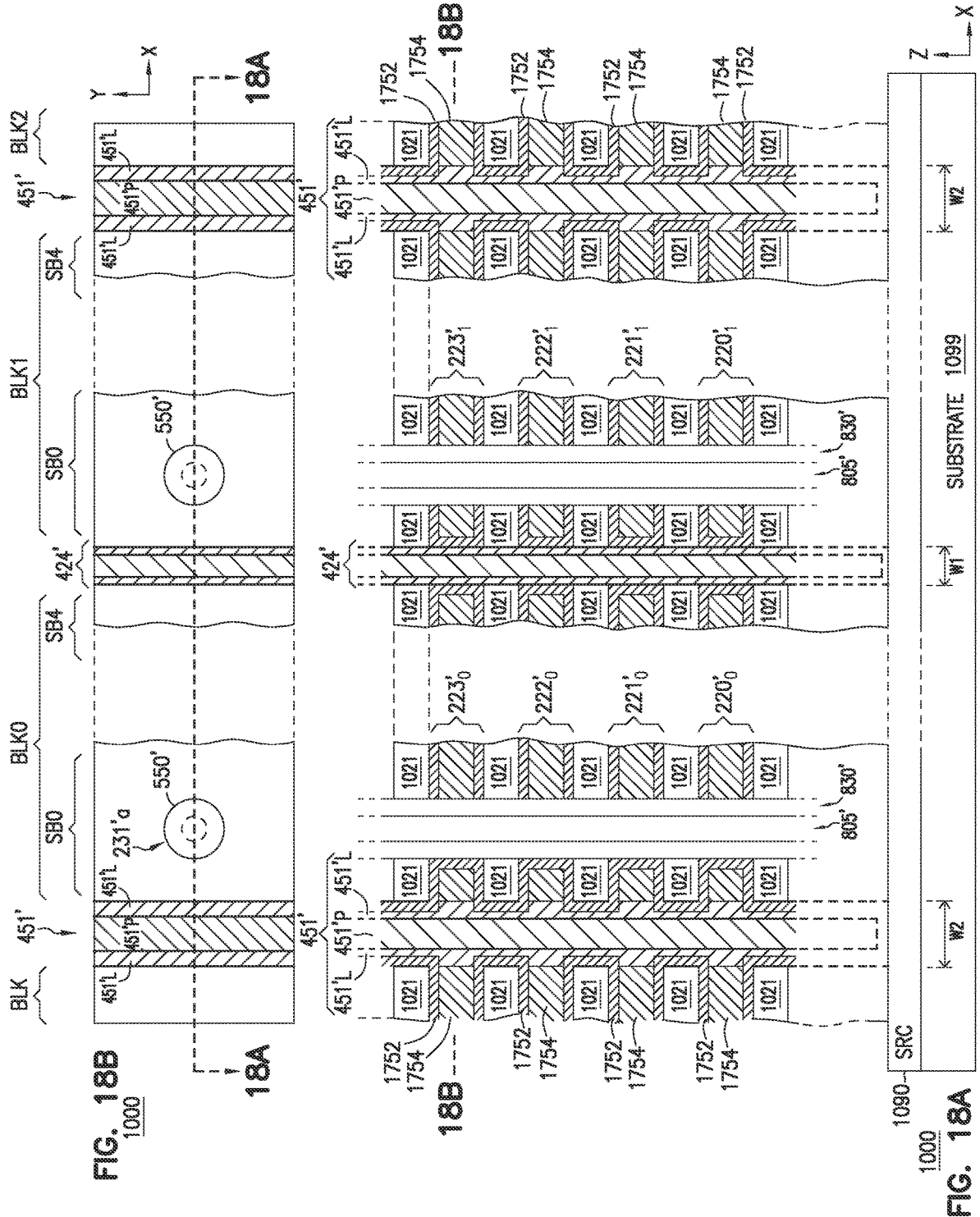

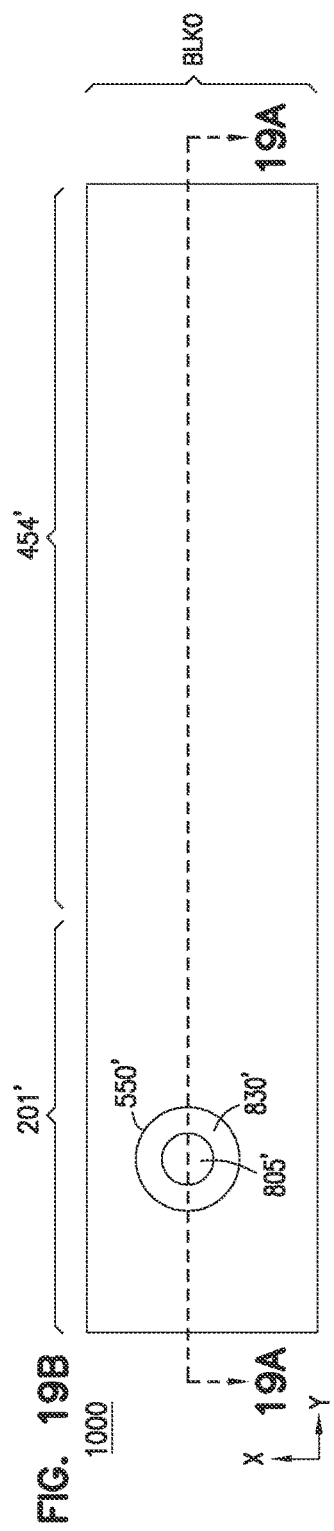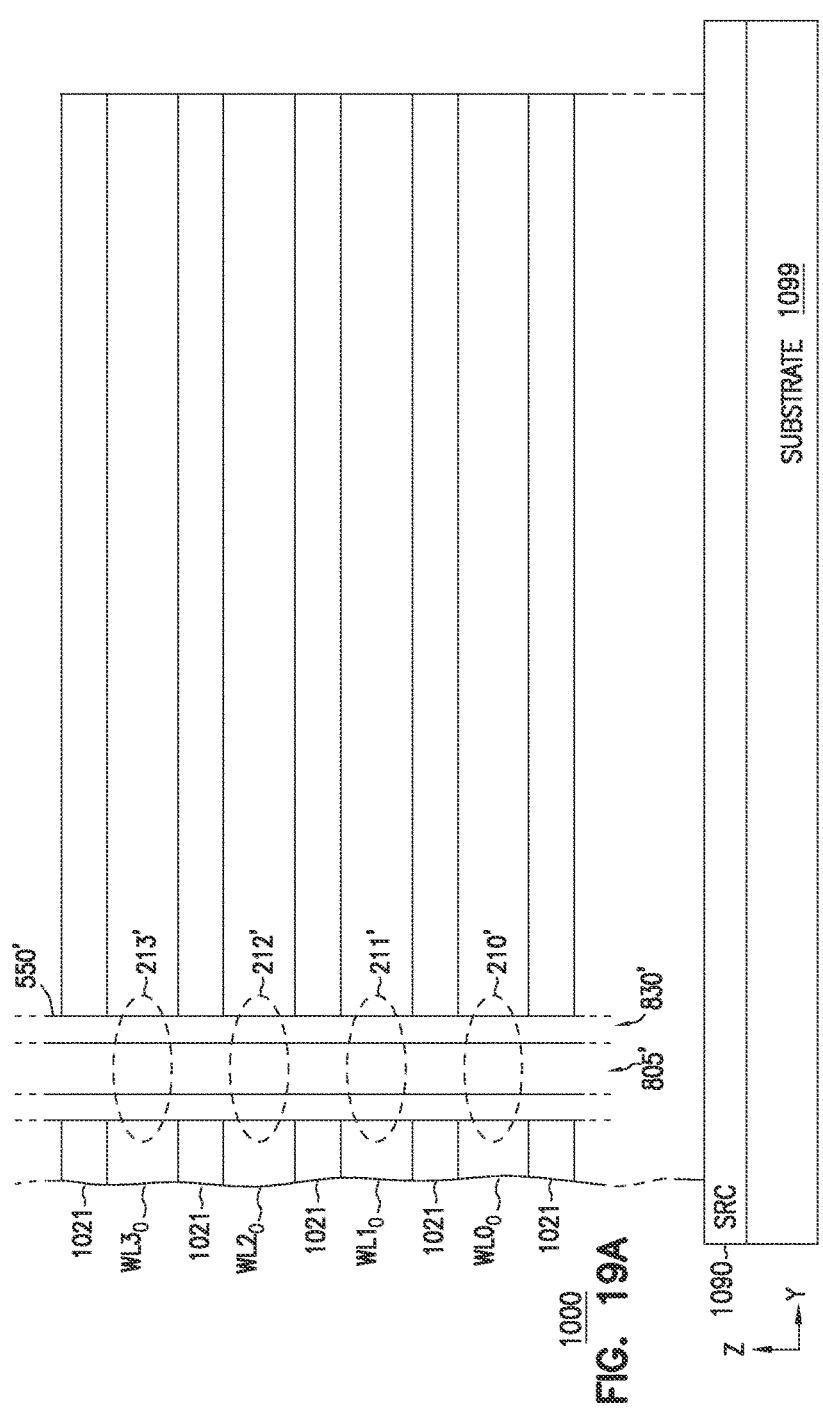

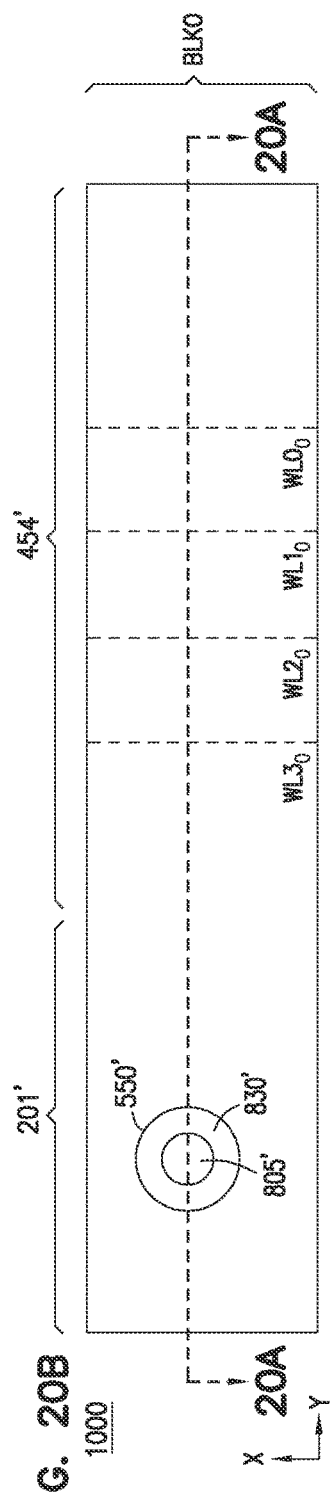
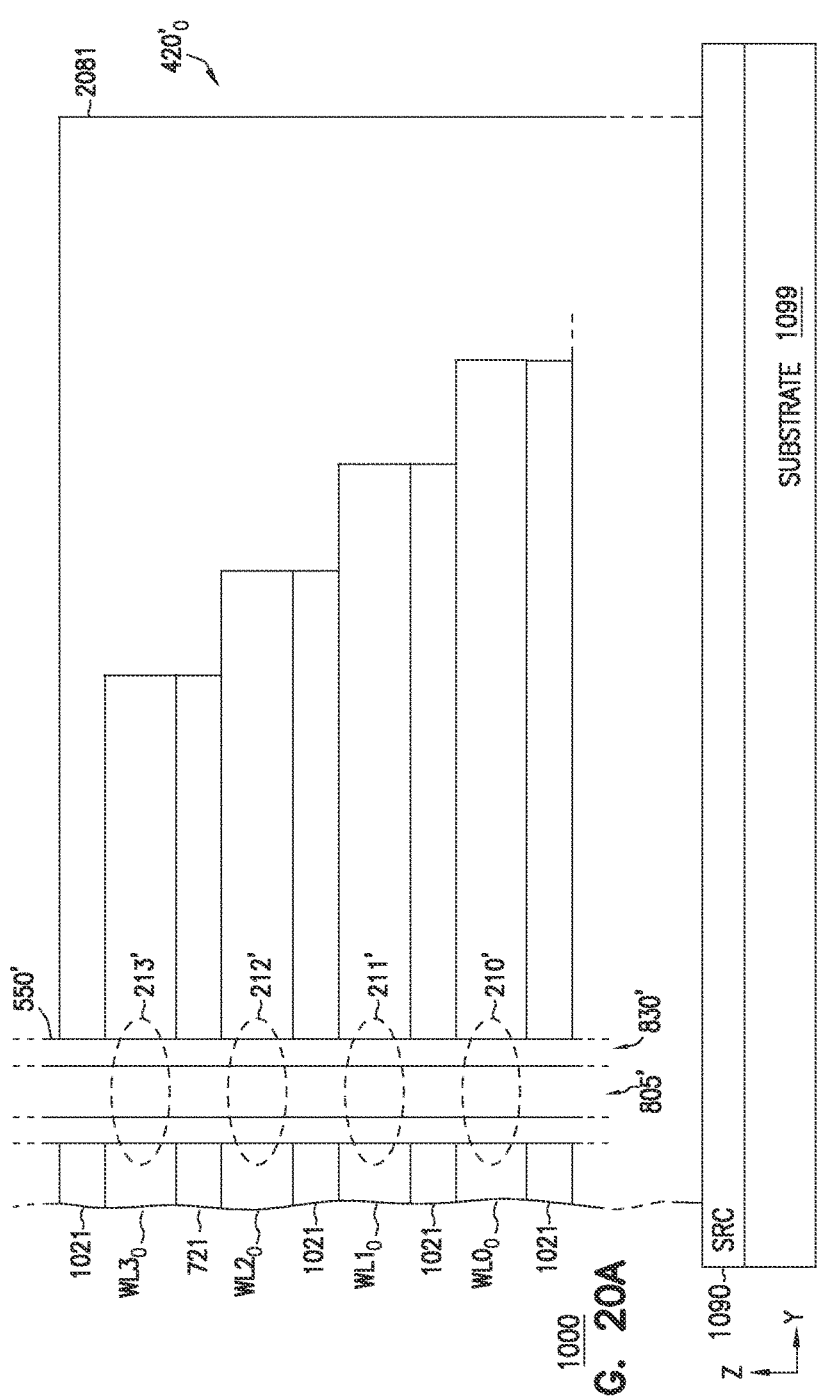

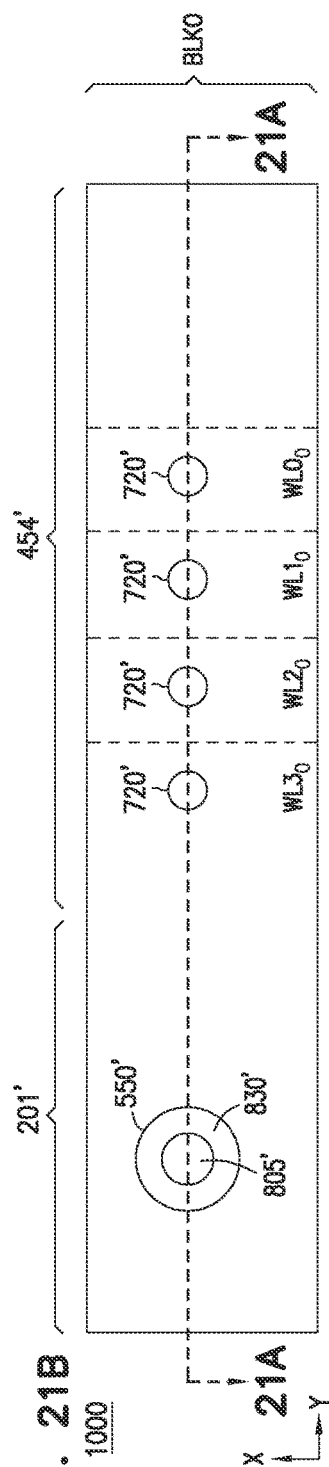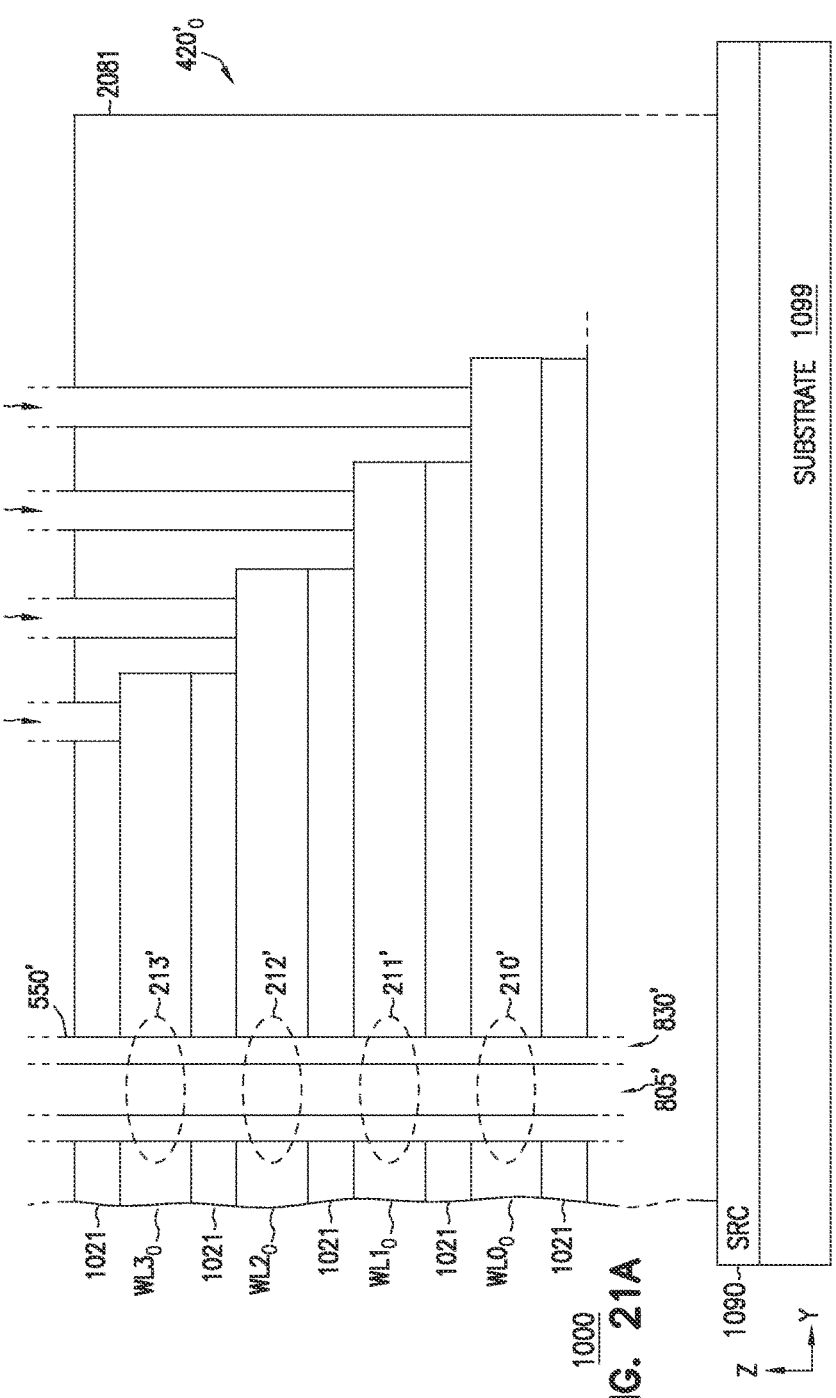

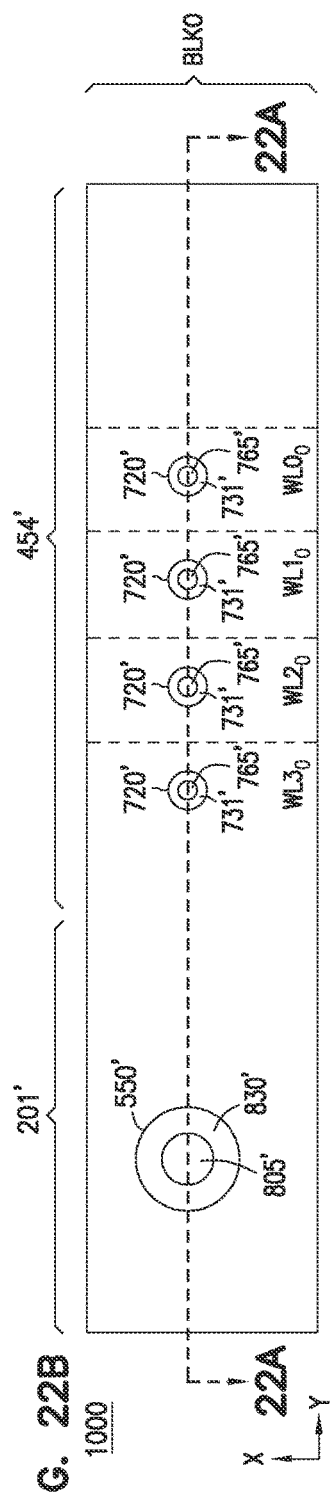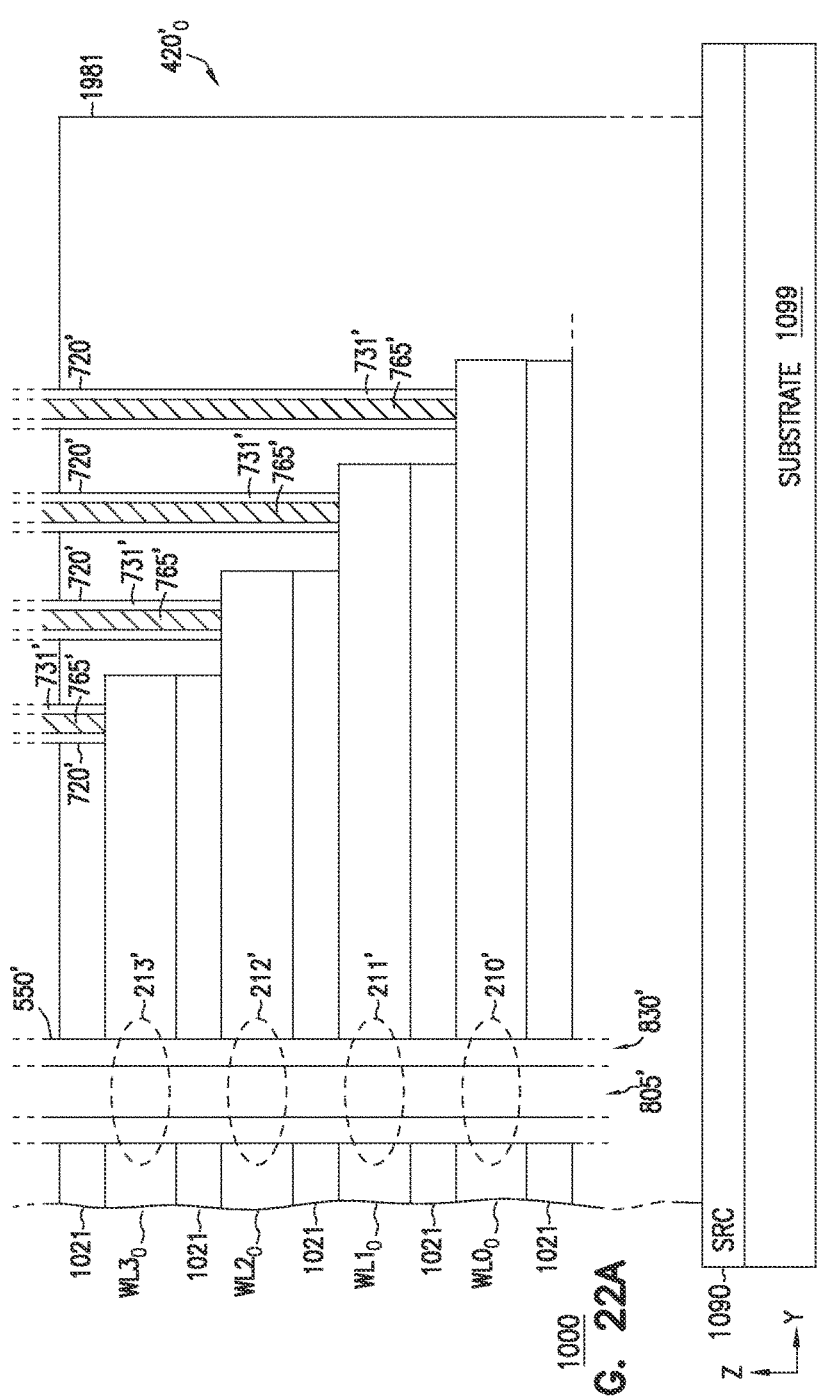
FIG. 22B
FIG. 22A

US 11,700,732 B2

MEMORY DEVICE INCLUDING DIFFERENT DIELECTRIC STRUCTURES BETWEEN BLOCKS

TECHNICAL FIELD

Embodiments described herein relate to memory devices including dielectric structures separation between blocks of memory cells.

BACKGROUND

Memory devices are widely used in computers and many other electronic items. A memory device usually has numerous memory cells used to store information (e.g., data) and data lines to carry information (in the form of electrical signals) to and from the memory cells. During fabrication of the memory device, the memory cells are often divided into physical blocks. In some conventional processes of forming the memory device, the blocks in the memory device are susceptible to block-bending error where the structures of the blocks may bend. Moderate block-bending error can result in poor electrical connections between such conductive elements. Severe block-bending error can lead to failures in some electric connections in the memory device.

BRIEF DESCRIPTION OF THE DRAWINGS

FIG. 9 shows a cross-section (e.g., top view) of a portion of a control gate and a pillar of the memory device of FIG. 8, according to some embodiments described herein.

FIG. 10A and FIG. 10B through FIG. 22A and FIG. 22B show different views of elements during processes of forming a memory device, according to some embodiments described herein.

DETAILED DESCRIPTION

The techniques described herein involve a memory device having different dielectric structures between blocks of the memory device. The dielectric structures can be formed at different processes during formation of the blocks. Such formation can stabilize the structure of the blocks to mitigate or reduce block bending errors. As described in more detail below, the different dielectric structures can increase memory cell density of the memory device. Improvements and benefits of the techniques described herein are further discussed below with reference to FIG. 1 through FIG. 22B.

Figure 1:
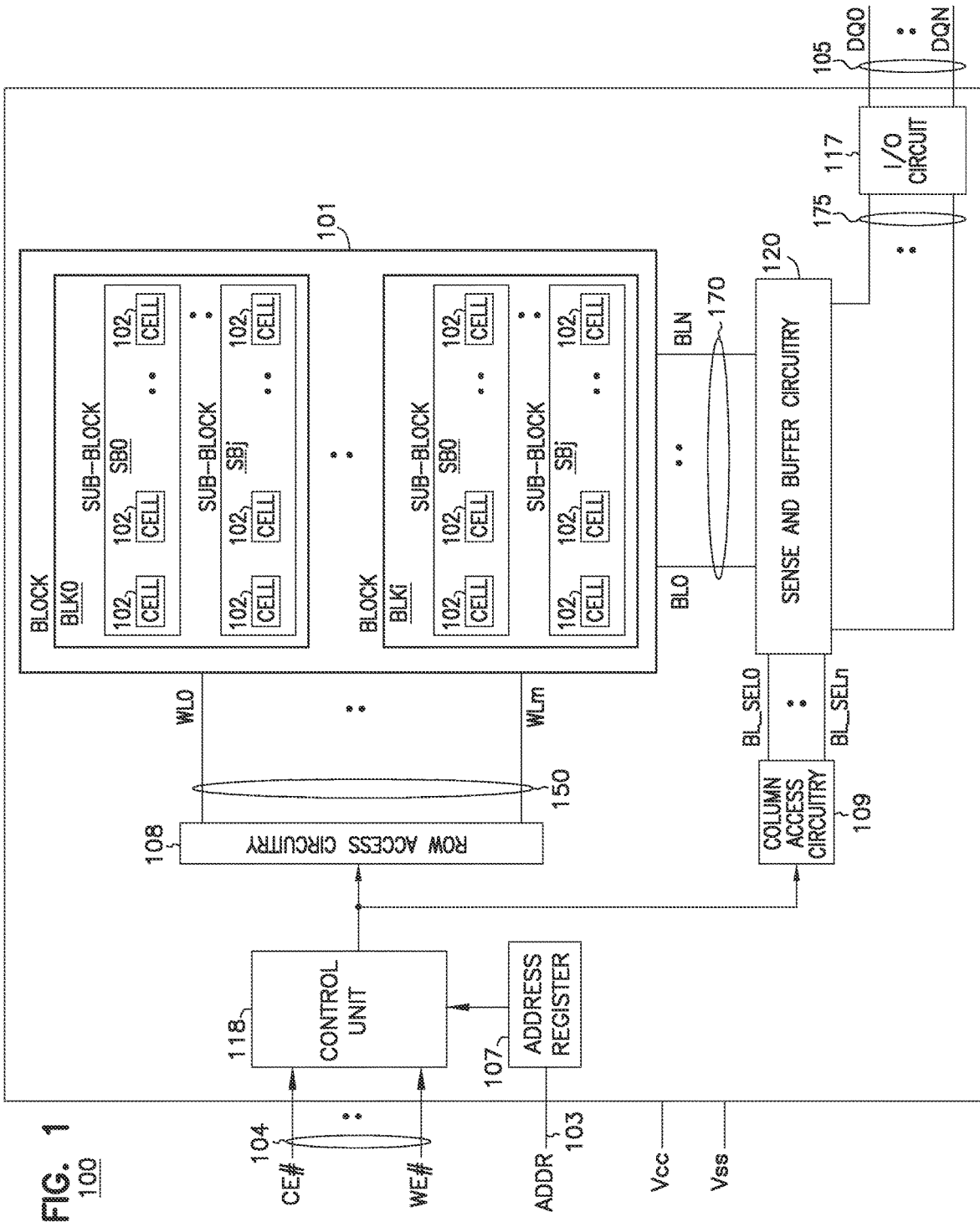
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks BLK0 through BLKi. Each of blocks BLK0 through BLKi can include its own sub-blocks, such as sub-blocks SB0 through SBj. A sub-block is a portion of a block. In the physical structure of memory device 100, memory cells 102 can be arranged vertically (e.g., stacked one over another) over a substrate (e.g., a semiconductor substrate) of memory device 100.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks BLK0 through BLKi and data lines 170 to selectively exchange information (e.g., data) with memory cells 102 of blocks BLK0 through BLKi. Data lines can be shared among blocks BLK0 through BLKi.

Each of blocks BLK0 through BLKi can have its own access lines (e.g., word lines) that are electrically separated from access lines (e.g., word lines) of the other blocks. Alternatively, two or more of blocks BLK0 through BLKi can share access lines. Sub-blocks of the same block can share access lines (e.g., can share word lines) and can be controlled by the same access lines. For example, sub-blocks SB0 through SBj can share a group of access lines (among access lines 150) associated with block BLK0, and sub-blocks SB0 through SBj of block BLKi can share another group of access lines (among access lines 150) associated with block BLKi.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks BLK0 through BLKi are to be accessed during a memory operation. Memory device 100 can perform a read operation to read (e.g., sense) information (e.g., previously stored information) from memory cells 102 of blocks BLK0 through BLKi, or a write (e.g., programming) operation to store (e.g., program) information in memory cells 102 of blocks BLK0 through BLKi. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks BLK0 through BLKi.

Memory device 100 can include a control unit 118 that can be configured to control memory operations of memory device 100 based on control signals on lines 104. Examples of the control signals on lines 104 include one or more clock signals and other signals (e.g., a chip enable signal CE #, a write enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that causes memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks BLK0 through BLKi and provide the value of the information to lines (e.g., global data lines) 175. Sense and buffer circuitry 120 can also be configured to use signals on lines 175 to determine the value of information to be stored (e.g., programmed) in memory cells 102 of blocks BLK0 through BLKi (e.g., during a write operation) based on the values (e.g., voltage values) of signals on lines 175 (e.g., during a write operation).

Memory device 100 can include input/output (I/O) circuitry 117 to exchange information between memory cells 102 of blocks BLK0 through BLKi and lines (e.g., I/O lines) 105. Signals DQ0 through DQN on lines 105 can represent information read from or stored in memory cells 102 of blocks BLK0 through BLKi. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "01", "100", "101", "110", and "111" of three bits, or one of other values of another number of multiple bits (e.g., more than three bits in each memory cell). A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3D NAND) or a NOR flash memory device, or another kind of memory device, such as a variable resistance memory device (e.g., a phase change memory device or a resistive Random Access Memory (RAM) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 22B.

Figure 2:
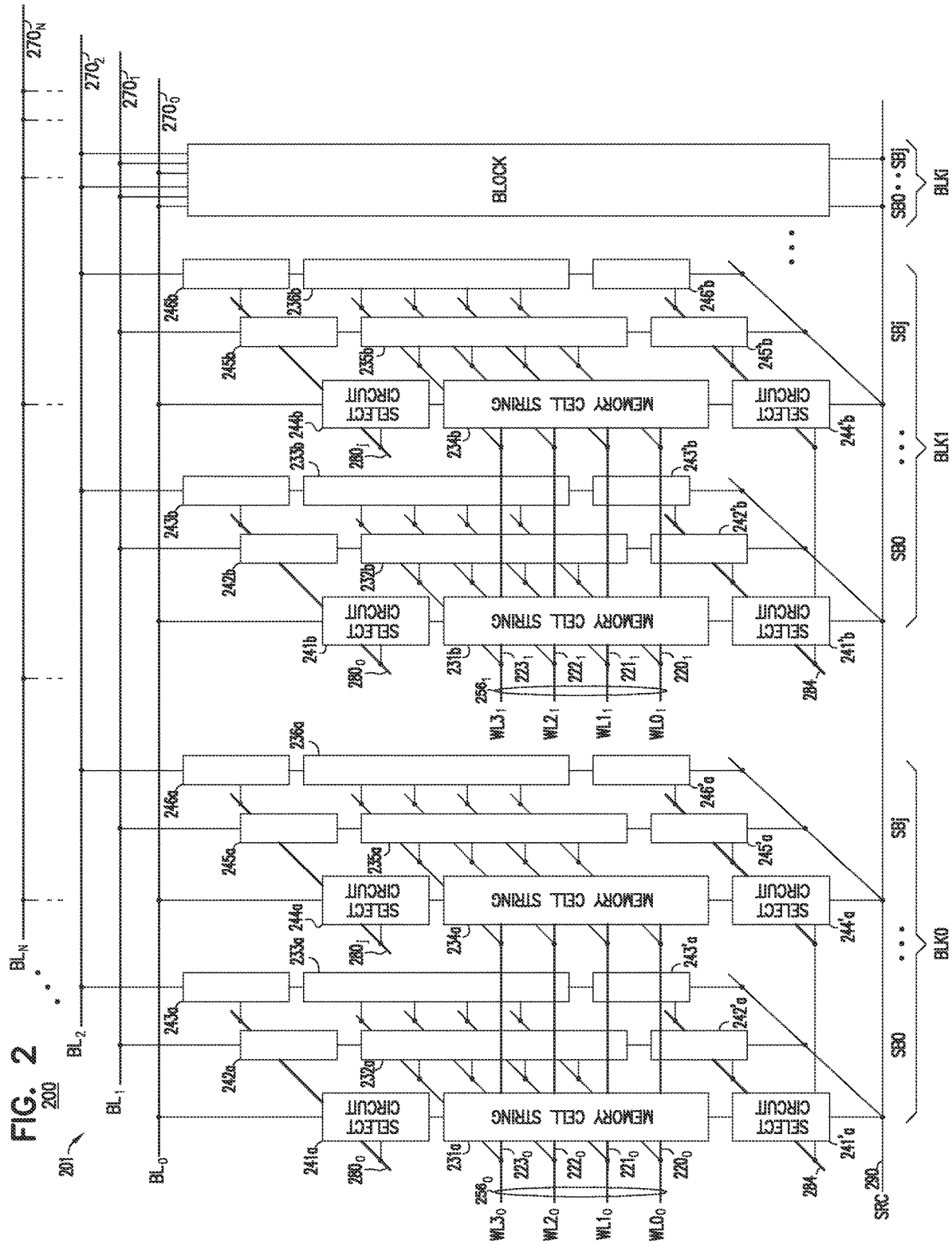
FIG. 2 shows a general schematic diagram of a portion of a memory device including a memory array having blocks (blocks of memory cells) and sub-blocks in each of the blocks, according to some embodiments described herein.

FIG. 2 shows a general schematic diagram of a portion of a memory device 200 including a memory array 201 having blocks (blocks of memory cells) BLK0 through BLKi and sub-blocks SB0 through SBj in each of the blocks, according to some embodiments described herein. Memory device 200 can correspond to memory device 100 of FIG. 1. For example, memory array 201 can form part of memory array 101 of FIG. 1.

In the physical structure of memory device 200, blocks BLK0 through BLKi can be arranged (e.g., formed) one block next to another block, such that each block is adjacent another block. Adjacent blocks are neighboring blocks and are located next to each other.

Sub-blocks SB0 through SBj in each of blocks BLK0 through BLKi are smaller portions of each block. Blocks BLK0 through BLKi can include the same number of sub-blocks. For example, each of blocks BLK0 through BLKi can include four sub-blocks (e.g., sub-blocks SB0, SB1, SB2, and SB3).

As shown in FIG. 2, each sub-block (e.g., SB0 or SBj) has its own memory cell strings that can be associated with (e.g., coupled to) respective select circuits. The sub-blocks of the blocks (e.g., blocks BLK0 through BLKi) of memory device 200 can have the same number of memory cell strings and associated select circuits.

For example, sub-block SB0 of block BLK0 has memory cell strings 231a, 232a, and 233a and associated select circuits (e.g., drain select circuits) 241a, 242a, and 243a, respectively, and select circuits (e.g., source select circuits) 241'a, 242'a, and 243'a, respectively. In another example, sub-block SBj of block BLK0 has memory cell strings 234a, 235a, and 236a and associated select circuits (e.g., drain select circuits) 244a, 245a, and 246a, respectively, and select circuits (e.g., source select circuits) 244'a, 245'a, and 246'a, respectively.

Similarly, sub-block SB0 of block BLK1 has memory cell strings 231b, 232b, and 233b, and associated select circuits (e.g., drain select circuits) 241b, 242b, and 243b, respectively, and select circuits (e.g., source select circuits) 241'b, 242'b, and 243'b, respectively. Sub-block SBj of block BLK1 has memory cell strings 234b, 235b, and 236b, and associated select circuits (e.g., drain select circuits) 244b, 245b, and 246b, respectively, and select circuits (e.g., source select circuits) 244'b, 245'b, and 246'b, respectively.

FIG. 2 shows an example of three memory cell strings and their associated circuits in a sub-block (e.g., in sub-block SB0). The number of memory cell strings and their associated select circuits in each the sub-block of blocks BLK0 through BLKi can vary. Each of the memory cell strings of memory device 200 can include series-connected memory cells (shown in detail in FIG. 3 and FIG. 4) and a pillar (e.g., pillar 550 in FIG. 5) where the series-connected memory cells can be located (e.g., vertically located) along respective portion of the pillar.

As shown in FIG. 2, memory device 200 can include data lines $270_0$ through $270_N$ that carry signals $BL_0$ through $BL_N$, respectively. Each of data lines $270_0$ through $270_N$ can be structured as a conductive line that can includes conductive materials (e.g., conductively doped polycrystalline silicon (doped polysilicon), metals, or other conductive materials).

The memory cell strings of blocks BLK0 through BLKi can share data lines $270_0$ through $270_N$ to carry information (in the form of signals) read from or to be stored in memory cells of selected memory cells (e.g., selected memory cells in block BLK0 or BLK1) of memory device 200. For example, memory cell strings 231a, 234a (of block BLK0), 231b and 234b (of block BLK1) can share data line $270_0$. Memory cell strings 232a, 235a (of block BLK0), 232b and 235b (of block BLK1) can share data line $270_1$. Memory cell strings 233a, 236a (of block BLK0), 233b and 236b (of block BLK1) can share data line $270_2$.

Memory device 200 can include a source (e.g., a source line, a source plate, or a source region) 290 that can carry a signal (e.g., a source line signal) SRC. Source 290 can be structured as a conductive line or a conductive plate (e.g., conductive region) of memory device 200. Source 290 can be common source (e.g., common source plate or common source region) of blocks BLK0 through BLKi. Alternatively, each of blocks BLK0 through BLKi can have its own source similar to source 290. Source 290 can be coupled to a ground connection of memory device 200.

Each of blocks BLK0 through BLKi can have its own group of control gates for controlling access to memory cells of the memory cell strings of the sub-block of a respective block. As shown in FIG. 2, memory device 200 can include control gates (e.g., word lines) $220_0$, $221_0$, $222_0$, and $223_0$ in block BLK0 that can be part of conductive paths (e.g., access lines) $256_0$ of memory device 200. Memory device 200 can include control gates (e.g., word lines) $220_1$, $221_1$, $222_1$, and $223_1$ in block BLK1 that can be part of other conductive paths (e.g., access lines) $256_1$ of memory device 200. Conductive paths $256_0$ and $256_1$ can correspond to part of access lines 150 of memory device 100 of FIG. 1.

As shown in FIG. 2, control gates $220_0$, $221_0$, $222_0$, and $223_0$ can be electrically separated from each other. Control gates $220_1$, $221_1$, $222_1$, and $223_1$ can be electrically separated from each other. Control gates $220_0$, $221_0$, $222_0$, and $223_0$ can be electrically separated from control gates $220_1$, $221_1$, $222_1$, and $223_1$. Thus, blocks BLK0 through BLK1 can be accessed separately (e.g., accessed one at a time). For example, block BLK0 can be accessed at one time (e.g., time t1) using control gates $220_0$, $221_0$, $222_0$, and $223_0$, and block BLK1 can be accessed at another time using control gates $220_1$, $221_1$, $222_1$, and $223_1$ at another time (e.g., time t2).

Memory device 200 can have the same number of control gates among the blocks (e.g., blocks BLK0 through BLKi) of memory device 200. In the example of FIG. 2, memory device 200 has four control gates in each of blocks BLK0 through BLKi. FIG. 2 shows memory device 200 including four control gates in each of blocks BLK0 through BLKi as an example. The number of control gates of the blocks (e.g., blocks BLK0 through BLKi) of memory device 200 can be different from four. For example, each of blocks BLK0 through BLKi can include up to hundreds (or more) of control gates.

Each of control gates $220_0$, $221_0$, $222_0$, and $223_0$ can be part of a structure (e.g., a level) of a conductive material (e.g., a layer of conductive material) located in a level of memory device 200. Control gates $220_0$, $221_0$, $222_0$, and $223_0$ can carry corresponding signals (e.g., word line signals) $WL0_0$, $WL1_0$, $WL2_0$, and $WL3_0$. Memory device 200 can use signals $WL0_0$, $WL1_0$, $WL2_0$, and $WL3_0$ to selectively control access to memory cells of block BLK0 during an operation (e.g., read, write, or erase operation). For example, during a read operation, memory device 200 can use signals $WL0_0$, $WL1_0$, $WL2_0$, and $WL3_0$ to control access to selected memory cells of block BLK0 to read (e.g., sense) information (e.g., previously stored information) from the memory cells of block BLK0. In another example, during a write operation, memory device 200 can use signals $WL0_0$, $WL1_0$, $WL2_0$, and $WL3_0$ to control access to selected memory cells of block BLK0 to store information in the selected memory cell of block BLK0.

Each of control gates $220_1$, $221_1$, $222_1$, and $223_1$ can be part of a structure (e.g., a level) of a conductive material (e.g., a layer of conductive material) located in a level of memory device 200. Control gates $220_1$, $221_1$, $222_1$, and $223_1$ can carry corresponding signals (e.g., word line signals) $WL0_0$, $WL1_0$, $WL2_0$, and $WL3_0$. Memory device 200 can use signals $WL0_1$, $WL1_1$, $WL2_1$, and $WL3_1$ to selectively control access to memory cells of block BLK0 during an operation (e.g., read, write, or erase operation). For example, during a read operation, memory device 200 can use signals $WL0_1$, $WL1_1$, $WL2_1$, and $WL3_1$ to control access to selected memory cells of block BLK1 to read (e.g., sense) information (e.g., previously stored information) from the memory cells of block BLK1. In another example, during a write operation, memory device 200 can use signals $WL0_1$, $WL1_1$, $WL2_1$, and $WL3_1$ to control access to selected memory cells of block BLK1 to store information in the selected memory cell of block BLK1.

As shown in FIG. 2, in sub-block SB0 of block BLK0, memory device 200 can include a select line (e.g., drain select line) $280_0$ that can be shared by select circuits 241a, 242a, and 243a. In sub-block SBj of block BLK0, memory device 200 can include a select line (e.g., drain select line) $280_j$ that can be shared by select circuits 244a, 245a, and 246a. Block BLK0 can include a select line (e.g., source select line) 284 that can be shared by select circuits 241'a, 242'a, 243'a, 244'a, 245'a, and 246'a.

In sub-block SB0 of block BLK1, memory device 200 can include a select line (e.g., drain select line) $280_0$, which is electrically separated from select line $280_0$ of block BLK1. Select line $280_0$ of block BLK1 can be shared by select circuits 241b, 242b, and 243b. In sub-block SBj of block BLK1, memory device 200 can include a select line (e.g., drain select line) $280_j$ that can be shared by select circuits 244b, 245b, and 246b. Select lines $280_0$ and $280_j$ of block BLK1 are electrically separated from select lines $280_0$ and $280_j$ of block BLK0. Block BLK1 can include a select line (e.g., source select line) 284 that can be shared by select circuits 241'b, 242'b, 243'b, 244'b, 245'b, and 246'b.

FIG. 2 shows an example where memory device 200 includes one drain select line (e.g., select line $280_0$) shared by select circuits (e.g., select circuits 241a, 242a, or 243a) in a sub-block (e.g., sub-block SB0 of block BLK0). However, memory device 200 can include multiple drain select lines shared by select circuits in a sub-block. FIG. 2 shows an example where memory device 200 includes one source select line (e.g., select line 284) associated shared by source select circuits (e.g., select circuits 241'a, 242'a, or 243'a) in a sub-block (e.g., sub-block SB0 of block BLK0). However, memory device 200 can include multiple source select lines shared by source select circuits in a sub-block.

In FIG. 2, each of the drain select circuits of memory device 200 can include a drain select gate (e.g., a transistor, shown in FIG. 3) between a respective data line and a respective memory cell string. The drain select gate (e.g., transistor) can be controlled (e.g., turned on or turned off) by a signal on the respective drain select line based on voltages provided to the signal.

In FIG. 2, each of the source select circuits of memory device 200 can include a source select gate (e.g., a transistor, shown in FIG. 3) coupled between source 290 and a respective memory cell string. The source select gate (e.g., transistor) can be controlled (e.g., turned on or turned off) by a signal on a respective source select line based on a voltage provided to the signal.

In FIG. 2, each of the memory cell strings of memory device 200 has memory cells (shown in FIG. 3) arranged in a string (e.g., coupled in series among each other) to store information. During an operation (e.g., read, write, or erase operation) of memory device 200, the memory cell strings can be individually selected to access the memory cells in the selected memory cell string in order to store information in or read information from the selected memory cell string. One or both select circuits (a drain select circuit and a source select circuit) associated with a selected memory cell string can be activated (e.g., by turning on the select gates (e.g., transistors) in the select circuit (or selected circuits)), depending on which operation memory device 200 performs on the selected memory cell string.

Activating a particular select circuit among the select circuits of memory device 200 during an operation of memory device 200 can include providing (e.g., applying) voltages having certain values to the signals on select lines associated with that particular select circuit. When a particular drain select circuit of memory device 200 is activated, it can electrically connect (e.g., form a current path from) a selected memory cell string associated with that particular select circuit to a respective data line (e.g., one of data lines $270_0$ through $270_N$). When a particular source select circuit is activated, it can electrically connect (e.g., form a current path from) a selected memory cell string associated with that particular select circuit to source 290.

Figure 3:
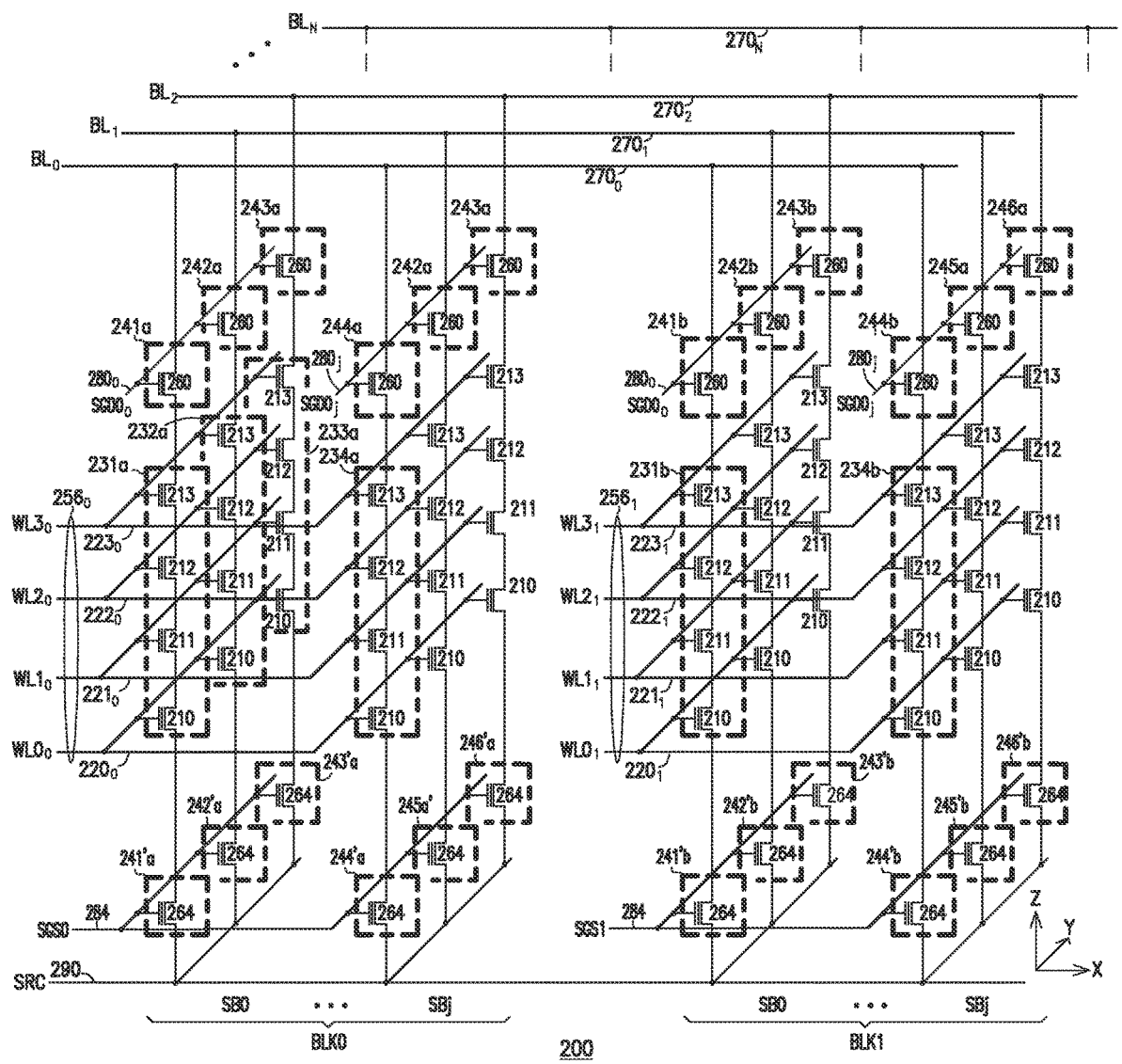
FIG. 3 shows a detailed schematic diagram including two adjacent blocks of the blocks of memory device of FIG. 2, according to some embodiments described herein.

FIG. 3 shows a detailed schematic diagram including blocks of the blocks BLK0 and BLK1 of memory device 200 of FIG. 2, according to some embodiments described herein. In the physical structure of memory device 200 blocks BLK0 and BLK1 are adjacent blocks (e.g., neighboring blocks). Adjacent blocks are located immediately next to each other, such that there is no additional block (or there are no additional blocks) between the adjacent blocks.

In FIG. 3, directions X, Y, and Z in FIG. 3 can be relative to the physical directions (e.g., three dimensional (3D) dimensions) of the structure of memory device 200. For example, the Z-direction can be a direction perpendicular to (e.g., vertical direction with respect to) a substrate of memory device 200 (e.g., a substrate 599 shown in FIG. 5). The Z-direction is perpendicular to the X-direction and Y-direction (e.g., the Z-direction is perpendicular to an X-Y plane of memory device 200).

For simplicity, only some of the memory cell strings and some of the select circuits of memory device 200 of FIG. 2 are labeled in FIG. 3. As shown in FIG. 3, each select line can carry an associated separate select signal. For example, in sub-block SB0 of block BLK0, select line (e.g., drain select line) $280_0$ can carry signal (e.g., drain select-gate signal) $SGD0_0$. In sub-block SBj of block BLK0, select line (e.g., drain select line) $280_j$ can carry signal (e.g., drain select-gate signal) $SGD0_j$. Sub-blocks SB0 and SBj of block BLK0 can share select line 284 that can carry signal (e.g., source select-gate signal) SGS0.

In sub-block SB0 of block BLK1, select line (e.g., drain select line) $280_j$ can carry signal (e.g., drain select-gate signal) $SGD0_j$. In sub-block SBj of block BLK1, select line (e.g., drain select line) $280_j$ can carry signal (e.g., drain select-gate signal) $SGD0_j$. Sub-blocks SB0 and SBj of block BLK1 can share select line 284 that can carry signal (e.g., source select-gate signal) SGS1.

For simplicity, similar or the same elements in the memory devices (e.g., memory device 200) described herein are given the same label. For example, as shown in FIG. 3, similar drain select lines (and their associated signals) are given the same labels for simplicity. However, as shown in FIG. 3, the drain select lines (from the same block or from different blocks) of memory device 200 are electrically separated from each other and carry different signals (although the signals are given the same labels).

As shown in FIG. 3, memory device 200 can include memory cells 210, 211, 212, and 213; select gates (e.g., drain select gates or transistors) 260; and select gates (e.g., source select gates) 264 that can be physically arranged in three dimensions (3D), such as X, Y. and Z directions (e.g., dimensions), with respect to the structure (shown in FIG. 4) of memory device 200.

In FIG. 3, each of the memory cell strings (e.g., memory cell string 231a) of memory device 200 can include series-connected memory cells that include one of memory cells 210, one of memory cells 211, one of memory cells 212, and one of memory cells 213. FIG. 3 shows an example of four memory cells 210, 211, 212, and 213 in each memory cell string. The number of memory cells in each memory cell string can vary. For example, each memory string can include up to hundreds (or more) of memory cells.

As shown in FIG. 3, each drain select circuit (e.g., select circuit 241a) can include one of select gates 260. Each source select circuit (e.g., select circuit 241'a) can include one of select gates 264.

Each of select gates 260 in FIG. 3 can operate like a transistor. For example, select gate 260 of select circuit 241a can operate like a field effect transistor (FET), such as a metal-oxide semiconductor FET (MOSFET). An example of such a MOSFET include an n-channel MOS (NMOS) transistor.

As shown in FIG. 3, a select line shared among particular select circuits in a sub-block can be shared by (e.g., can be used to control) respective select gates of those particular select circuits. For example, select line $280_0$ of sub-block SB0 of block BLK0 can be shared by (e.g., can be used to control) select gates 260 of select circuits 241a, 242a, and 243a of sub-block SB0 of block BLK0. In another example, select line 284 of sub-block SB0 of block BLK0 can be shared by select gates 264 of select circuits 241'a, 242'a, and 243'a of sub-block SB0 of block BLK0.

A select line (e.g., select line $280_0$ of sub-block SB0 of block BLK0) can carry a signal (e.g., signal $SGD0_0$) but it does not operate like a switch (e.g., a transistor). A select gate (e.g., select gate 260 of select circuit 241a) can receive a signal (e.g., signal $SGD0_0$) from a respective select line (e.g., select line $280_0$ of sub-block SB0 of block BLK0) and can operate like a switch (e.g., a transistor).

In the physical structure of memory device 200, a select line (e.g., select line $280_0$ of sub-block SB0 of block BLK0) can be a structure (e.g., a level) of a conductive material (e.g., a layer (e.g., a piece) or a region of conductive material) located in a single level of memory device 200. The conductive material can include metal, doped polysilicon, or other conductive materials.

In the physical structure of memory device 200, a select gate (e.g., select gate 260 of select circuit 241a sub-block SB0 of block BLK0) can include (can be formed from) a portion of the conductive material of a respective select line (e.g., select line $280_0$ of sub-block SB0 of block BLK0), a portion of a channel material (e.g., polysilicon channel), and a portion of a dielectric material (e.g., similar to a gate oxide of a transistor (e.g., FET)) between the portion of the conductive material and the portion of the channel material.

FIG. 3 shows an example where memory device 200 includes one drain select gate (e.g., select gate 260) in each drain select circuit, and one source select gate (e.g., select gate 264) in each source select circuit coupled to a memory cell string. However, memory device 200 can include multiple drain select gates (e.g., multiple select gates 260 connected in series) in each drain select circuit, multiple source select gates (e.g., multiple select gates 264 connected in series) in each source select circuit, or both multiple drain select gates and multiple source select gates coupled to a memory cell string.

As described above, memory device 200 (FIG. 3) can include blocks BL0 through BLj. FIG. 2 shows a detailed schematic diagram of blocks BLK0 and BLK1. The structure of a portion of memory device is described below.

Figure 4:
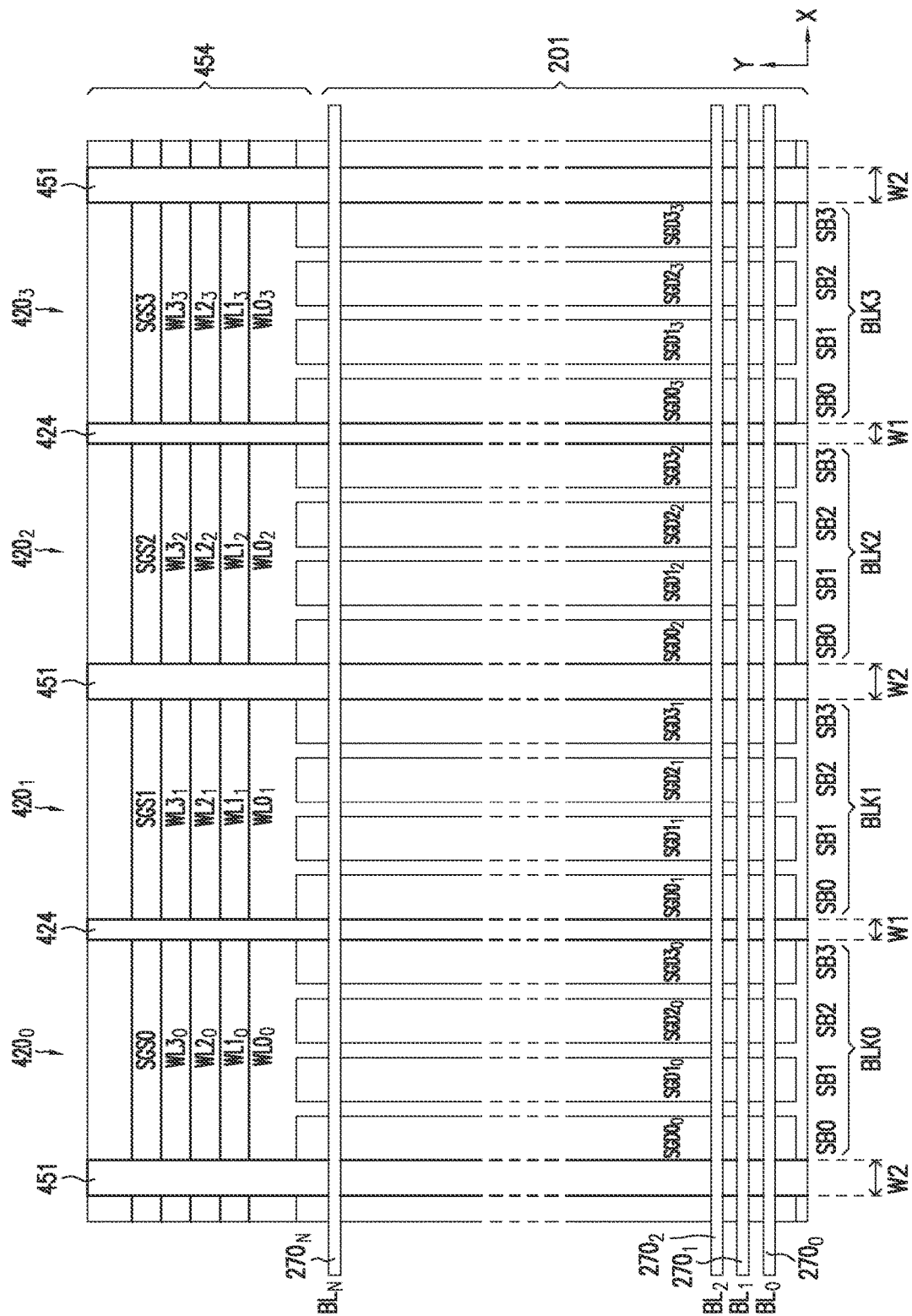
FIG. 4 shows a top view of a structure of a portion of the memory device of FIG. 3 including a memory array, a staircase region, and dielectric structures between the blocks of the memory device, according to some embodiments described herein.

FIG. 4 shows a top view of a structure of a portion of memory device 200 of FIG. 2 and FIG. 3 including a memory array 201 including blocks BLK0. BLK1, BLK2, and BLK3, and dielectric structures (e.g., dielectric dividers) 424 and 451 separating one block from another, according to some embodiments described herein. For simplicity, some elements of memory device 200 (and other memory devices described herein) may be omitted from a particular figure of the drawings so as not to obscure the view or the description of the element (or elements) being described in that particular figure. Further, the dimensions (e.g., physical structures) of the elements of memory device 200 (and other memory devices) in the drawings described herein are not scaled. Moreover, the description of the same elements of memory device 200 described above with reference to FIG. 2 and FIG. 3 are also not repeated.

As shown in FIG. 4, blocks BLK0, BLK1, BLK2, and BLK3 are four adjacent blocks (e.g., four neighboring blocks) that are located immediately next to each other. For example, blocks BLK0 and BLK1 are adjacent blocks. Blocks BLK1 and BLK2 are adjacent blocks. Blocks BLK2 and BLK3 are adjacent blocks. Blocks BLK0. BLK1, BLK2, and BLK3 have separate control gates for respective memory cells of respective blocks.

As shown in FIG. 4, the control gates (associated with signals $WL0_0$, $WL1_0$, $WL2_0$, $WL3_0$) of block BLK0 have a length in the Y-direction from memory array 201 of memory device 200 to a staircase region 454 (shown in detail in FIG. 7) of memory device. The control gates of block BLK0 can be stacked one over another in the Z-direction (shown in a side view in FIG. 5). As shown in FIG. 4, select line (associated with signal SGS0) of block BLK0 can located under (with respect to the Z-direction) the control gates of block BLK0.

Block BLK0 can include a staircase structure $420_0$ at staircase region 454 of memory device 200. Staircase structure $420_0$ can be formed from portions (e.g., end portions) of the control gates (associated with signals $WL0_0$, $WL1_0$, $WL2_0$, $WL3_0$) of block BLK0. As described in detail below with reference to FIG. 7 (which shows a side view of staircase structure $420_0$), conductive contacts (e.g., conductive contact (e.g., word line contacts) 765) can be formed at staircase structure $420_0$ on respective control gates of block BLK0 to allow signals (e.g., signals $WL0_0$, $WL1_0$, $WL2_0$, $WL3_0$) to be provided to respective control gates of block BLK0 through the conductive contacts at staircase structure $420k$. Blocks BLK1, BLK2, and BLK3 have their own staircases $420_1$ $420_2$, and $420_3$, respectively.

As shown in FIG. 4, block BLK0 can include sub-blocks (e.g., four sub-blocks) SB0, SB1, SB2, and SB3 and select lines (e.g., four drain select lines) associated with signals $SGD0_0$, $SGD1_0$, $SGD2_0$, and $SGD3_0$, respectively. The select lines can include respective conductive regions (e.g., conductive materials) that are electrically separated from each other and can be located on the same level (with respect to the Z-direction) and over (with respect to the Z-direction) the control gates of block BLK0. As shown in FIG. 4, each of the select lines (associated with signals $SGD0_0$, $SGD1_0$, $SGD2_0$, and $SGD3_0$) can have length in the Y-direction from memory array 201 to staircase region 454.

Blocks BLK1. BLK2, and BLK3 can have structures like block BLK0. As shown in FIG. 4, block BLK1 can include control gates associated with signals $WL0_1$, $WL1_1$, $WL2_1$, and $WL3_1$ (also shown in FIG. 3), select line (e.g., source select line) associated with signal SGS1 (also shown in FIG. 3), sub-blocks SB0, SB1, SB2, and SB3, select lines (e.g., drain select lines) $SGD0_1$, $SGD1_1$, $SGD2_1$, and $SGD3_1$, and a staircase structure $420_1$. Conductive contacts (e.g., word line contacts) can be formed at staircase structure $420_1$ to allow signals (e.g., signals $WL0_1$, $WL_1$, $WL2_1$, $WL3_1$) to be provided to respective control gates of block BLK2 through the conductive contacts at staircase structure $420_1$.

Block BLK2 can include control gates associated with signals $WL0_2$, $WL1_2$, $WL2_2$, and $WL3_2$, a select line (e.g., source select line) associated with signal SGS2, sub-blocks SB0, SB1, SB2, and SB3, select lines (e.g., drain select lines) $SGD0_2$, $SGD1_2$, $SGD2_2$, and $SGD3_2$, and a staircase structure $420_2$. Conductive contacts (e.g., word line contacts) can be formed at staircase structure $420_2$ to allow signals (e.g., signals $WL)_2$, $WL12$, $WL2_2$, $WL3_2$) to be provided to respective control gates of block BLK2 through the conductive contacts at staircase structure $420_2$.

Block BLK3 can include control gates associated with signals $WL0_3$, $WL1_3$, $WL2_3$, and $WL3_3$, a select line (e.g., source select line) associated with signal SGS3, sub-blocks SB0, SB1, SB2, and SB3, select lines (e.g., drain select lines) $SGD0_3$, $SGD1_3$, $SGD2_3$, and $SGD3_3$, and a staircase structure $420_3$. Conductive contacts (e.g., word line contacts) can be formed at staircase structure $420_3$ to allow signals (e.g., signals $WL0_3$, $WL1_3$, $WL2_3$, $WL3_3$) to be provided to respective control gates of block BLK3 through the conductive contacts at staircase structure $420_3$.

In the physical structure of memory device 200, the select lines of each block (e.g., four select lines associated with signals $SGD0_0$, $SGD1_0$, $SGD2_0$, and $SGD3_0$ in block BLK0) can include conductive regions (e.g., four respective conductive regions or conductive lines) that are electrically separated from each other and can have respective lengths in the Y-direction parallel to the lengths of dielectric structures 424 and 451.

FIG. 4 shows an example where each block of memory device 200 can have four sub-blocks. However, the number of sub-blocks can be different from four.

As shown in FIG. 4, dielectric structures 424 can interleave (in the X-direction) with dielectric structures 451, such that each of dielectric structures 424 can be located between two dielectric structures 451. Dielectric structures 424 and 451 can also be structured (e.g., arranged) such that each of dielectric structures 424 and 451 can be located between two adjacent blocks and electrically separates the control gates of the adjacent blocks from each other. For example, dielectric structure 424 between blocks BLK0 and BLK1 can electrically separate the control gates (associated with signals $WL0_0$, $WL1_0$, $WL2_0$, $WL3_0$) from the control gates (associated with signals $WL0_1$, $WL1_1$, $WL2_1$, $WL3_1$) of block BLK1.

In another example, dielectric structure 451 between blocks BLK1 and BLK2 can electrically separate the control gates (associated with signals $WL0_1$, $WL1_1$, $WL2_1$, $WL3_1$) of block BLK1 from the control gates (associated with signals $WL0_2$, $WL1_2$, $WL2_2$, $WL3_2$) of block BLK2.

In another example, dielectric structure 424 between blocks BLK2 and BLK3 can electrically separate the control gates (associated with signals $WL0_2$, $WL1_2$, $WL2_2$, $WL3_2$) of block BLK2 from the control gates (associated with signals $WL0_3$, $WL1_3$, $WL2_3$, $WL3_3$) of block BLK3.

Each of dielectric structures 424 can have length in the Y-direction, and a height (e.g., a depth) in the Z-direction (shown in FIG. 5), and a width W1 in the X-direction. Width W1 can also be viewed as a thickness of dielectric structure 424 in the X-direction, which is a direction from one block to another block. For example, dielectric structure 424 between block BLK0 and block BLK1 has width W1 (or a thickness) in a direction (e.g., the X-direction) from block BLK0 to block BLK1.

Each of dielectric structures 451 can have length in the Y-direction, and a height (e.g., a depth) in the Z-direction (shown in FIG. 5), and a width W2 in the X-direction. Width W2 can also be viewed as a thickness of dielectric structure 451 in the X-direction, which is a direction from one block to another block. For example, dielectric structure 451 between block BLK0 and block BLK1 has width W2 (or a thickness) in a direction (e.g., the X-direction) from block BLK0 to block BLK1.

Each of dielectric structures 424 and 451 can include a dielectric material (or materials) formed in a slit (e.g., a trench) along the lengths between two adjacent blocks. Each of dielectric structures 424 and 451 can be formed to electrically separate the control gates of the adjacent blocks from each other.

Each of width W1 and width W2 can be measured in a fraction of meter unit (e.g., in nanometer (nm) unit). Width W1 can be less than width W2. For example, width W1 can have a range from 200 nm to 220 nm. Width W2 can have a range from 250 nm to 280 nm.

Thus, as shown in FIG. 4, memory device 200 can have different dielectric structures (e.g., dielectric structures 424 and 451) between the blocks (e.g., blocks BLK0, BL1, BLK2, and BLK3). Two blocks can be adjacent dielectric structure 424, and two blocks can be adjacent dielectric structure 451.

The structure of memory device 200 as shown in FIG. 4 can allow it to have improvements and benefits over some conventional memory devices. For example, since some of the dielectric structures (e.g., dielectric structures 424) can be formed with relatively smaller width (e.g., width W1) than other dielectric structures (e.g., dielectric structures 451), the size (e.g., in the X-direction) of memory device 200 can be relatively smaller in comparison with conventional memory devices where dielectric structures are the same (e.g., having the width like width W2). Further, memory cell density for a given area of memory device 200 can be relatively higher (because of the smaller size) in comparison with such conventional memory devices.

Figure 5:
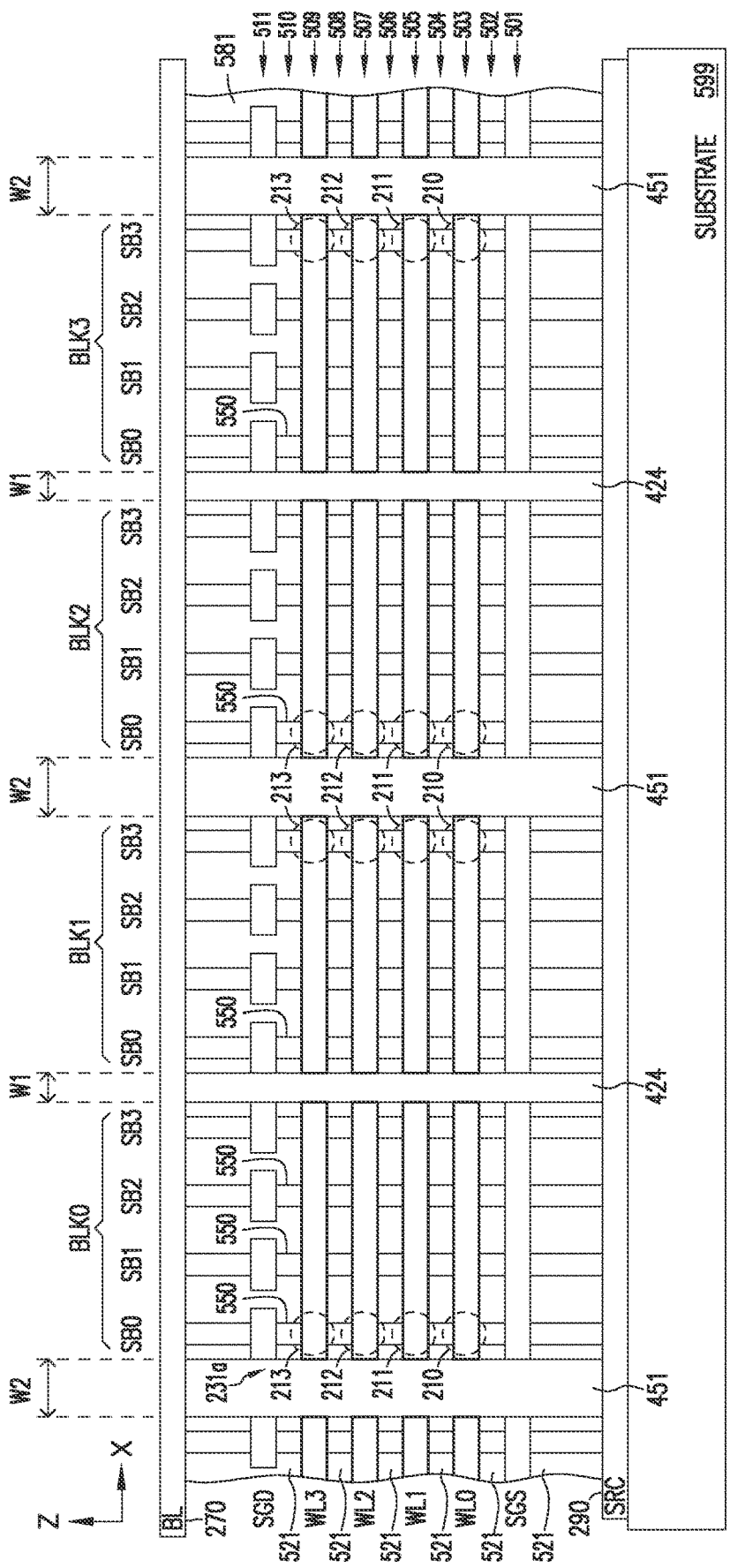
FIG. 5 shows a side view (e.g., cross-section) of a structure of a portion of the memory device of FIG. 4, including the dielectric structures that extend through and separate control gates of the blocks, according to some embodiments described herein.

FIG. 5 shows a side view (e.g., cross-section) of a structure of a portion of memory device 200 of FIG. 4 including the blocks BLK0, BLK1, BLK2, and BLK3, and dielectric structures 424 and 451 extending though and separating control gates of blocks BLK0, BLK1, BLK2, and BLK3, according to some embodiments described herein. As shown in FIG. 5, memory device 200 can include a substrate 599, source 290 formed over substrate, and different levels 501 through 511 (which are physical device levels of memory device 200) over substrate 599 in the Z-direction. Memory cells 210, 211, 212, and 213 (FIG. 3) of the memory cell strings (e.g., memory cell string 231a in FIG. 3) of respective sub-blocks SB0, SB1, SB3, and SB3 of each of blocks BLK0, BLK1, BLK2, and BLK3 can be formed over substrate 599 and source 290 (e.g., formed vertically in Z-direction in respective levels among levels 501 through 511).

In FIG. 5, a data line 270 can be one of data lines $270_0$ through $270_N$ in FIG. 4. Signal BL can be one of signals $BL_0$ through $BL_N$ FIG. 4.

In FIG. 5, the select lines (e.g., four drain select lines) indicated by signal SGD can correspond to respective select lines of a respective block among blocks BLK0, BLK1, BLK2, and BLK3. For example, in sub-block SB0, SB1. SB2, and SB3 of block BLK0, the select lines (e.g., four drain select lines) indicated by signal SGD can correspond to respective select lines associated with signals $SGD0_0$, $SGD1_0$, $SGD2_0$, and $SGD3_0$ of block BLK0 shown in FIG. 4. In another example, in sub-block SB0, SB1, SB2, and SB3 of block BLK1, the select lines (e.g., four drain select lines) indicated by signal SGD can correspond to respective select lines associated with signals $SGD0_1$, $SGD1_1$, $SGD2_1$, and $SGD3_1$ of block BLK1 shown in FIG. 4.

As shown in FIG. 5, the select lines (e.g., four drain select lines) in the same block (e.g., block BLK0) can include respective conductive regions (e.g., four conductive regions) that are electrically separated from each other and can be located on the same level (e.g., level 511) in Z-direction of memory device 200 and located over the control gates (in the Z-direction) of the respective block. The conductive regions of the select lines between different blocks (e.g., block BLK0. BLK1, BLK2, and BLL3) can also be located on the same level (e.g., level 511) in the Z-direction of memory device 200.

In FIG. 5, for simplicity, control gates (e.g., four control gates) of blocks BLK0, BLK1, BLK2, and BLK3 are indicated by the same signals WL0, WL1, WL2, and WL3. For example, in block BLK0, the control gates indicated by signals WL0, WL1, WL2, and WL3 can correspond to respective control gates associated with signals $WL0_0$, $WL1_0$, $WL2_0$, and $WL3_0$, respectively, of block BLK0 shown in FIG. 4. In another example, in block BLK1 in FIG. 5, the control gates indicated by signals WL0, WL1, WL2, and WL3 can correspond to respective control gates associated with signals $WL0_1$, $WL1_1$, $WL2_1$, and $WL3_1$, respectively, of block BLK0 shown in FIG. 4. As shown in FIG. 5, the control gates (associated with signals WL0, WL1, WL2, and WL3) in the same block are located (e.g., stacked one over another) on different levels in the Z-direction (e.g., levels 503, 505, 507, and 509) of memory device 200.

Memory device 200 can include dielectric materials (e.g., silicon dioxide) 521 located on levels 502, 504, 506, 508, and 510. Dielectric materials 521 in a respective block are interleaved with the control gates (associated with signals WL0, WL1, WL2, and WL3) in the respective block.

The select lines (e.g., source select lines) indicated by signal SGS can correspond to respective select lines of blocks BLK0, BLK1, BLK2, and BLK3. For example, in block BLK0, the select line indicated by signal SGS can correspond to the select line (e.g., source select line) associated with signals SGS0 of block BLK0 shown in FIG. 4. In another example, in block BLK1, the select line indicated by signal SGS can correspond to the select line (e.g., source select line) associated with signals SGS1 of block BLK1 shown in FIG. 4.

As shown in FIG. 5, each of dielectric structures 424 and 451 can have a height (e.g., a depth) in the Z-direction. The depth of each dielectric structure 424 and 451 can be a distance (e.g., vertical distance) between source 290 and data line 270 (e.g., one of data lines $270_0$ through $270_N$ in FIG. 4).

As shown in FIG. 5, memory device 200 can include pillars (memory cell pillars) 550 in blocks BL0, BLK1, BLK2, and BLK3. Each of pillars 550 can be part of a respective memory cell string (e.g., memory cell string 231a). Each of pillars 550 can have length extending outwardly (e.g., extending vertically in the direction of the Z-direction) from substrate 599 between substrate 599 and data line 270.

As shown in FIG. 5, memory cells 210, 211, 212, and 213 of respective memory cell strings (e.g., memory cell string 231a) can be located in different levels (e.g., levels 503, 505, 507, and 509) in the Z-direction of memory device 200. The control gates (associated with signals WL0, WL1, WL2, and WL3) of each of blocks BLK0, BLK1, BLK2, and BLK3 can be located on the same levels (e.g., levels 503, 505, 507, and 509) at which memory cells 210, 211, 212, and 213 are located. Thus, memory cells 210, 211, 212, and 213 and the control gates of blocks BLK0, BLK1. BLK2, and BLK3 can be located (e.g., vertically located) along respective portions (e.g., portions on levels 503, 505, 507, and 509) of pillars 550 in the Z-direction.

Substrate 599 of memory device 200 can include monocrystalline (also referred to as single-crystal) semiconductor material. For example, substrate 599 can include monocrystalline silicon (also referred to as single-crystal silicon). The monocrystalline semiconductor material of substrate 599 can include impurities, such that substrate 599 can have a specific conductivity type (e.g., n-type or p-type).

Although not shown in FIG. 5, memory device 200 can include circuitry located in (e.g., formed in) substrate 599. At least a portion of the circuitry can be located in a portion of substrate 599 that is under (e.g., directly under) memory cell strings of blocks BLK0, BLK1, BLK2, and BLK3. The circuitry can include decoder circuits, driver circuits (e.g., word line drivers), buffers, sense amplifiers, charge pumps, and other circuitry of memory device 200.

In FIG. 5, source 290 can include a conductive material (or materials (e.g., different levels of different materials)) and can have a length extending in the X-direction. FIG. 5 shows an example where source 290 can be formed over a portion of substrate 599 (e.g., by depositing a conductive material over substrate 599). Alternatively, source 290 can be formed in or formed on a portion of substrate 599 (e.g., by doping a portion of substrate 599).

Memory device 200 can also include dielectric materials (not labeled in FIG. 5) interleaved with other elements (e.g., interleaved with the control gates of blocks BLK0, BLK1, BLK2, and BLK3) in different levels of memory device 200. For example, memory device 200 can include dielectric materials (e.g., silicon dioxide) interleaved with the control gates (associated with signals WL0, WL1, WL2, and WL3) of blocks BLK0, BLK1, BLK2, and BLK3.

Example materials for the control gates (associated with signals WL0, WL1, WL2, and WL3) of blocks BLK0. BLK1, BLK2, and BLK3 include a single conductive material (e.g., single metal (e.g., tungsten)) or a combination of different layers of conductive materials. For example, each of the control gates of blocks BLK0, BLK1, BLK2, and BLK3 can include (e.g., multi-layers of) aluminum oxide, titanium nitride, and tungsten.

The select lines (associated with signals SGS and SGD) blocks BLK0, BLK1, BLK2, and BLK3 can have the same material (or materials) as the control gates (associated with signals WL0, WL1, WL2, and WL3) of blocks BLK0, BLK1, BLK2, and BLK3. Alternatively, the select gates associated with signal SGS. SGD, or both have material (or materials) different from the material of the control gates.

Figure 6:
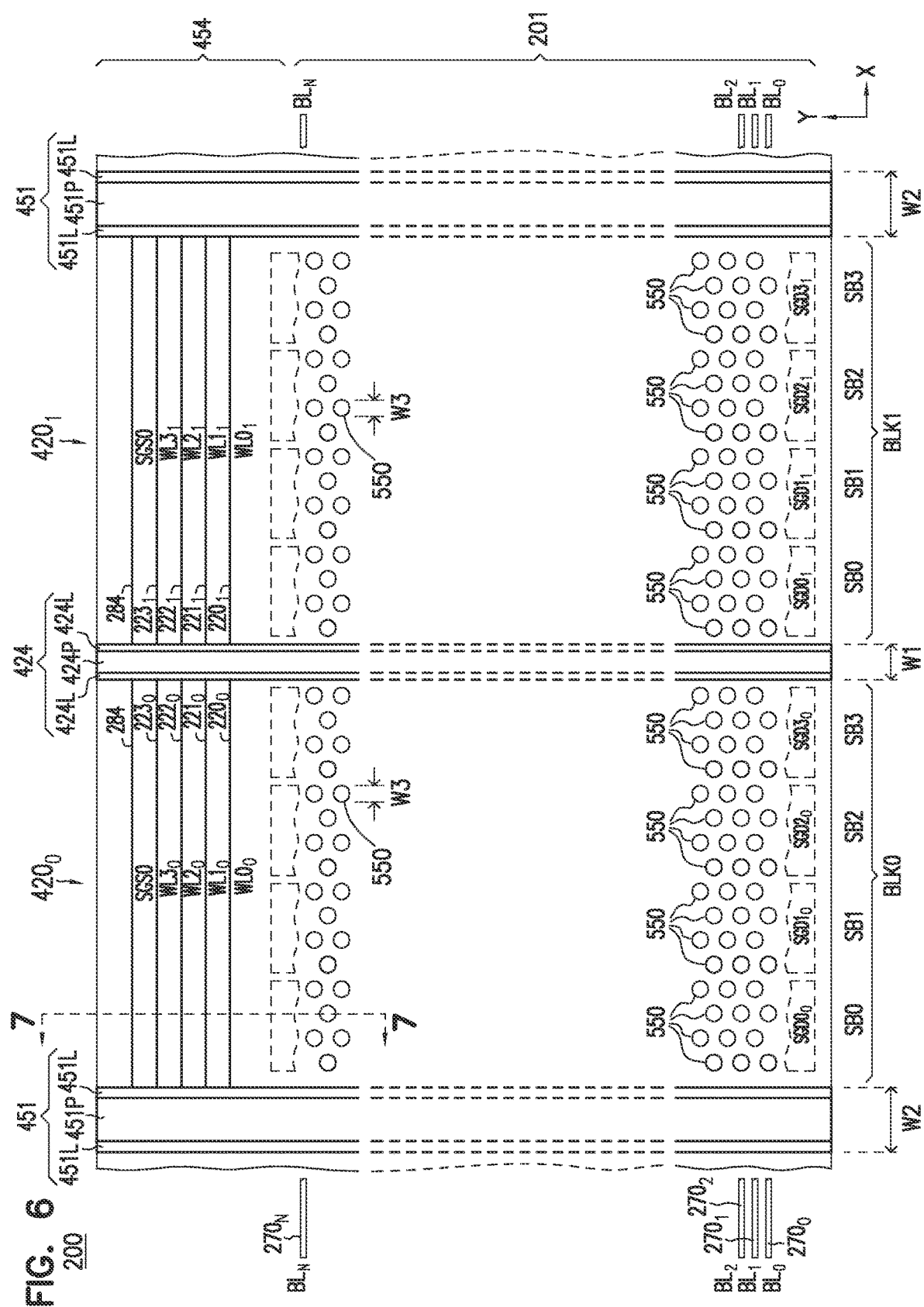
FIG. 6 shows a top view of a structure of a portion of the memory device of FIG. 4 and FIG. 5, including adjacent blocks, pillars in the blocks, and detail of the dielectric structures, according to some embodiments described herein.

FIG. 6 shows a top view of a structure of a portion of memory device 200 of FIG. 4 including blocks BLK0 and BLK1, dielectric structures 424 and 451, pillars 550, according to some embodiments described herein. In FIG. 6, select lines associated with signals $SGD0_0$, $SGD1_0$, $SGD2_0$, and $SDG3_0$ in block BLK0 and signals $SGD0_1$, $SGD1_1$, $SGD2_1$, and $SDG3_1$ in block BLK1 are partially shown as dotted lines. Each of sub-blocks SB0, SB1, SB2, and SB3 can include multiple rows of pillars 550 associated with a respective select line (one of the select lines associated with signals $SGD0_0$, $SGD1_0$, $SGD2_0$, and $SDG3_0$). As shown in FIG. 6, the multiple rows of pillars 550 are parallel to the lengths (in the Y-direction) of dielectric structures 424 and 451. For example, sub-block SB0 of block BLK0 can include four rows of pillars 550 associated with the select line associated with signal $SGD0_0$. In another example, sub-block SB1 of block BLK0 can include four row of pillars 550 (different from pillar 550s of sub-block SB0) associated the select line associated with signal $SGD0_1$. Other sub-blocks can include respective pillars 550 as shown in FIG. 6. Thus, block BLK0 can include 16 rows of pillars 550 (four rows of pillars 550 in each of the four sub-blocks). Similarly, block BLK1 can have 16 rows of pillars 550. Thus, in memory device 200, two blocks (e.g., blocks BLK0 and BLK1) adjacent dielectric structure 424 can have a total of 32 rows of pillars 550.

As shown in FIG. 6, each of pillars 550 can have a width (e.g., diameter) W3. Width is less than width W1. Width W3 can have a range from 100 nm to 110 nm.

FIG. 6 shows an example where each sub-block includes four rows of pillars 550. However, the number of rows in the sub-blocks can be less than four or greater than four.

In FIG. 6, data lines $270_0$ through $270_N$ are partially shown for simplicity. Data lines $270_0$ through $270_N$ can extend across (in the X-direction) the blocks (e.g., blocks BL0 and BL1) and located over pillars 550. Connections (e.g., vertical connections in the Z-direction) between pillars 550 and data lines $270_0$ through $270_N$ are not shown in FIG. 6. However, each pillar 550 in the same sub-block of a block can be coupled to a separate (e.g., unique) data line among data lines $270_0$ through $270_N$. Each of data lines $270_0$ through $270_N$ can be coupled to one pillar 550 from each sub-block of a block. For example, data line $270_0$ can be coupled to (e.g., shared by) four pillars 550 in block BLK0, one pillar 550 from each of sub-blocks SB0, SB1 SB2, and SB3 of block BLK0. In another example, data line $270_1$ can be coupled to (e.g., shared by) another four pillars 550 in block BLK0, one pillar 550 from each of sub-blocks SB0, SB1 SB2, and SB3 of block BLK0. In another example, data line $270_N$ can be coupled to (e.g., shared by) four pillars 550 in block BLK0, one pillar 550 from each of sub-blocks SB0, SB1 SB2, and SB3 of block BLK0.

Similarly, data line $270_1$ can be coupled to (e.g., shared by) four pillars 550 in block BLK1, one pillar 550 from each of sub-blocks SB0, SB1 SB2, and SB3 of block BLK1. In another example, data line $270_N$ can be coupled to (e.g., shared by) four pillars 550 in block BLK1, one pillar 550 from each of sub-blocks SB0, SB1 SB2, and SB3 of block BLK1.

Figure 8:
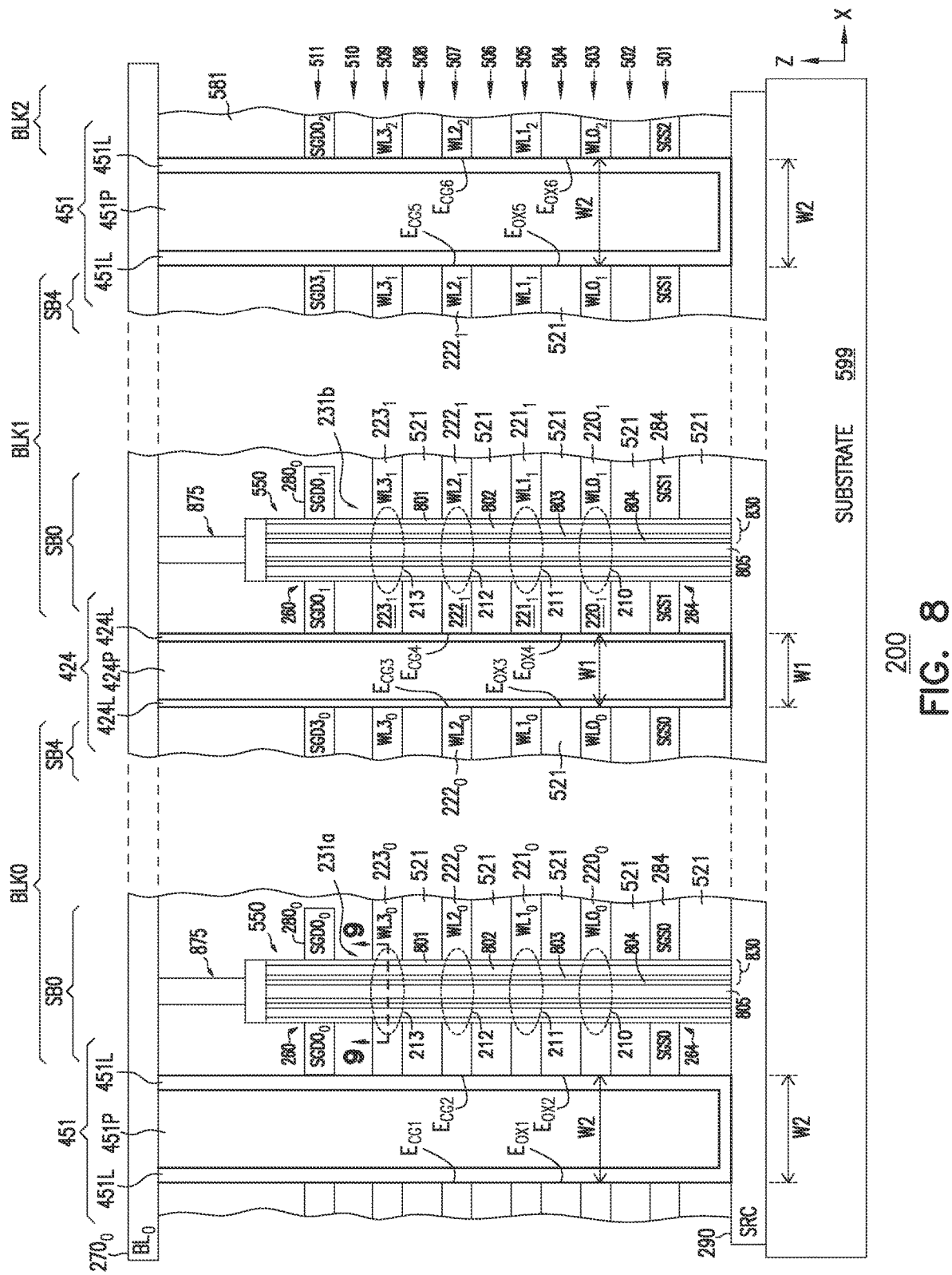
FIG. 8 shows a side view (e.g., cross-section) of a structure of a portion of the memory device of FIG. 4, including edges of control gates and dielectric materials of the blocks, and more detail of the pillars, according to some embodiments described herein.

Thus, in memory device 200 of FIG. 6, a data line (e.g., data line $270_0$) can be coupled to (e.g., shared by) eight pillars 550 from two adjacent blocks (e.g., blocks BLK0 and BLK1), four pillars 550 from respective sub-blocks of each of the two adjacent blocks. Although not shown in FIG. 6, data line $270_0$ can be coupled to other pillars 550 from other blocks (e.g., blocks BLK2 and BLK3) of memory device 200. Each pillar 550 can be coupled to a respective data line (among data lines $270_0$ through $270_N$) through a conductive structure. An example of the conductive structure (e.g., conductive structure 875) is shown in FIG. 8 (described below).

As shown in FIG. 6, dielectric structure 424 can include materials 424L and 424P formed in a slit (a trench, not labeled) between blocks BLK0 and BLK1. Material 424L can include a dielectric material (or multiple dielectric materials). Examples for material 424L include silicon dioxide ($SiO_2$) silicon oxynitride nitride (SiOxNy), silicon nitride (SixNy), high-k dielectric material, and other dielectric materials, or any combination (multiple layers) of these materials. A high-k dielectric material is a dielectric material that has a dielectric constant greater than that of dielectric constant of silicon dioxide. Material 424P can be different from material 424L. Material 424P can be a non-dielectric material. Examples for material 424P include polysilicon (e.g., n-type polysilicon or p-type polysilicon) and metal (e.g., tungsten). In an alternative structure of memory device 200, material 424P can be omitted, such that materials 424L can also occupy the location of material 424P.

Dielectric structure 451 can include materials 451L and 451P formed in a slit (e.g., a trench, not labeled) between blocks BLK1 and BLK2 (labeled in FIG. 5). The materials of dielectric structure 451 can be the same as or different from the materials of dielectric structure 424. Material 451L can include a dielectric material (or multiple dielectric materials). Examples for material 451L include silicon dioxide ($SiO_2$) silicon oxynitride nitride (SiOxNy), silicon nitride (SixNy), high-k dielectric material, and other dielectric materials, or any combination (multiple layers) of these materials. A high-k dielectric material is a dielectric material that has a dielectric constant greater than the dielectric constant of silicon dioxide. Material 451P can be different from material 451L. Material 451P can be a non-dielectric material. Examples for material 451P include polysilicon (e.g., n-type polysilicon or p-type polysilicon) and metal (e.g., tungsten).

FIG. 6 also shows another dielectric structure 451 (including materials 451L and 451P) between block BLK0 and an adjacent block (not labeled). Other dielectric structures 424 and 451 (shown in FIG. 5) of memory device 200 have the same structures (e.g., respective materials 424L, 424P, 451L, and 451P) as dielectric structures 424 and 451 shown in FIG. 6.

As shown in FIG. 6, pillars 550 can be located in memory array 201, which is adjacent staircase region 545 along the direction of the lengths of dielectric structures 424 and 451.

Figure 7:
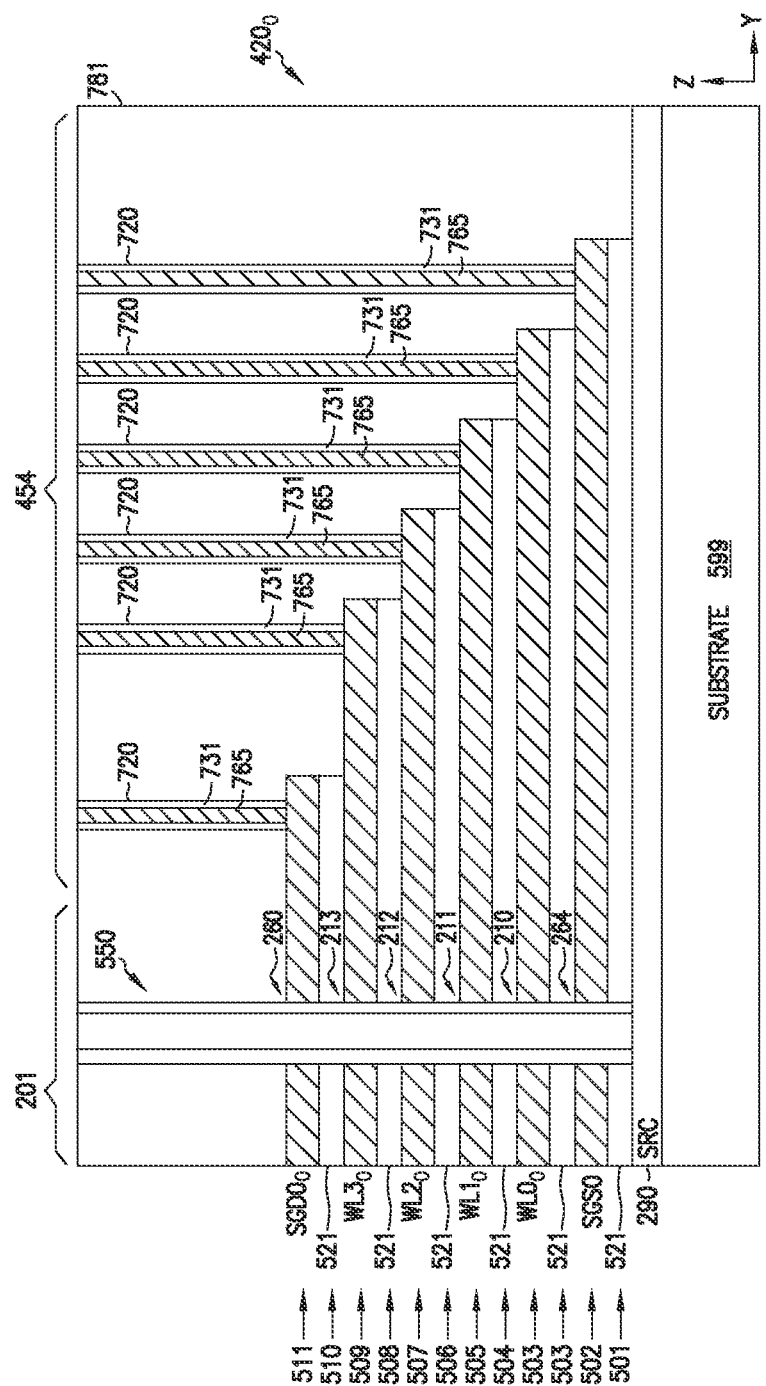
FIG. 7 shows a side view of a portion of the memory device of FIG. 6, including a portion of a staircase structure of one of the blocks of the memory device, according to some embodiments of described herein.

A side view (e.g., cross-section) along line 7-7 at staircase structure $420_0$ of block BLK0 is shown in FIG. 7.

FIG. 7 shows a side view of a portion of memory device 200 including a portion of staircase structure $420_0$ and a pillar 550 of block BLK0, according to some embodiments described herein. Levels 501 through 507 of memory device 200 in FIG. 7 are the same levels 501 through 507 of memory device 200 shown in FIG. 5. As shown in FIG. 7, pillar 550 can be located in the portion of memory device 200 that includes memory array 201 (also shown in top view in FIG. 4 and FIG. 6). Pillar 550 can extend through (e.g., through the materials of) the control gates and the select lines and dielectric materials 521 in the portions that include memory array 201. Staircase structure $420_0$ of block BLK0 in FIG. 7 can be located in the portion of memory device 200 that includes staircase region 454 (which is also shown in top view in FIG. 4 and FIG. 6).

As shown in FIG. 7, the control gates associated with signals $WL0_0$, $WL1_0$, $WL2_0$, and $WL3_0$, and the select lines associated with signals (e.g., drain select signal and source select signal) $SGD0_0$ and SGS0 can be structured (e.g., patterned), such that they can have different lengths in the Y-direction and their respective portions (e.g., end portions) can form staircase structure $420_0$. As shown in FIG. 7, staircase structure $420_0$ can have steps on respective levels (e.g., respective tiers) of memory device 200.

As shown in FIG. 7, memory device 200 can include openings (e.g., holes) 720 formed in a dielectric material 781 in staircase region 454. Memory device 200 can include dielectric materials (e.g., dielectric liners) 731 formed on sidewalls of respective openings 720. Memory device 200 can include conductive contacts 765 formed in respective openings 720. Conductive contacts 765 can contact (e.g., electrically couple to) respective control gates and select lines.

Memory device 200 can also include conductive paths (e.g., like conductive paths $256_0$ of memory device 200 of FIG. 2) coupled to respective conductive contacts 765. The conductive paths can be coupled to other circuitry (e.g., driver circuits in substrate 599) of memory device 200. Signals $WL0_0$, $WL1_0$, $WL2_0$, and $WL3_0$, $SGD0_0$ and SGS0 can be provided to respective control gates and select lines through the conductive paths and conductive contacts 765.

FIG. 8 shows a side view (e.g., cross-section) of a structure of a portion of memory device 200 shown in FIG. 2 through FIG. 7 including detail of pillars 550 and control gates of blocks BLK0 and BLK1, according to some embodiments described herein. FIG. 9 (described below) shows a cross-section (e.g., top view) of a portion of control gate $223_0$ and pillar 550 of memory device 200 taken along line 9-9 of FIG. 8.

The structure of memory device 200 in FIG. 8 corresponds to part of the schematic diagram of memory device 200 shown in FIG. 3 and the structure (side view) of memory device 200 shown in FIG. 5. For simplicity, only a portion of memory device 200 of FIG. 5 is shown in FIG. 8 and detailed description of similar or the same elements is not repeated.

Memory device 200 can include a conductive structure (e.g., conductive plug) 875 coupled between a respective pillar 550 and a respective data line (e.g., data line $270_0$). Conductive structure 875 coupled to pillar 550 of a memory cell string (e.g., memory cell string 231*a*) can form part of a conductive path (e.g., current path) between a data line (e.g., data line $270_0$) and source 290 through the respective memory cell string during an operation (e.g., read or write operation) of memory device 200.

As shown in FIG. 8, memory device 200 can include a structure 830 and a dielectric material 805 that can be part of a respective pillar 550. Structure 830 and a dielectric material 805 can extend continuously along a length of the respective pillar 550. Dielectric material 805 can include silicon dioxide. Structure 830 can be electrically coupled to source 290 and a respective data line (e.g., data line $270_0$). Structure 830 of a respective pillar 550 in a block is adjacent (e.g., contacts) portions of respective control gates of that block. For example, structure 830 of pillar 550 in block BLK0 is adjacent (e.g., contacts) control gates $220_0$, $221_0$, $222_0$, and $223_0$ of block BLK0.

FIG. 8 shows an example of structure 830 having a particular shape (e.g., the vertical cylindrical shape shown in FIG. 8). However, structure 830 can have a different shape (e.g., non-cylindrical shape). An example cross-section of the structure of pillar 550 along line 9-9 is shown in FIG. 9.

As shown in FIG. 8, structure 830 can include portions 801, 802, 803, and 804. Each of memory cells 210, 211, 212, and 213 of a memory cell string can include part of each of portions 801, 802, 803, and 804 that is located adjacent one of the control gates (one of control gates $220_0$, $221_0$, $222_0$, and $223_0$, $220_1$, $221_1$, $222_1$, and $223_1$). For example, memory cell 213 of memory cell string 231a can include part of structure 830 (portions 801, 802, 803, and 804) that is adjacent control gate $223_0$. In another example, memory cell 212 of memory cell string 231a can include part of structure 830 (portions 801, 802, 803, and 804) that is adjacent control gate $222_0$.

Structure 830 can include a conductive structure (e.g., portion 804) that can be part of a conductive path (e.g., pillar channel structure) to conduct current between a respective data line (e.g., data line $270_0$) coupled to structure 830 and source 290. Structure 830 can be part of a ONOS ($SiO_2$, $Si_3N_4$, $SiO_2$, Si) structure. For example, portion 801 can include $SiO_2$ that can be combined with part of an adjacent control gate to form a charge blocking material (or materials) that are capable of blocking a tunneling of a charge. Portion 802 can include a charge storage element (e.g., charge storage portion, charge storage material (or materials), such as $Si_3N_4$) that can provide a charge storage function (e.g., trap charge) to represent a value of information stored in memory cells 210, 211, 212, or 213. Portion 803 can include a dielectric, such as a tunnel dielectric material or materials (e.g., $SiO_2$), that is capable of allowing tunneling of a charge (e.g., electrons). Portion 804 can include polysilicon (e.g., doped or undoped polysilicon) and can be a channel structure (e.g., pillar channel) that can conduct current during operation of memory device 200. As an example, portion 803 can allow tunneling of electrons from portion 804 to portion 802 during a write operation and tunneling of electrons from portion 802 to portion 804 during an erase operation of memory device 200.

In an alternative arrangement, structure 830 can be part of a SONOS (Si, $SiO_2$, $Si_3N_4$, $SiO_2$, Si) structure, a TANOS (TaN, $Al_2O_3$, $Si_3N_4$, $SiO_2$, Si) structure, a MANOS (metal, $Al_2O_3$, $Si_3N_4$, $SiO_2$, Si) structure, or other structures. Alternatively, structure 830 can be part of a floating gate structure (e.g., portion 802 (charge storage portion) can be polysilicon).

The control gates and dielectric materials 521 of memory device 200 can include respective edges (e.g., vertical edges) adjacent (e.g., contacting) respective dielectric structures 424 and 451. FIG. 8 shows edges $E_{CG1}$, $E_{CG2}$, $E_{CG3}$, $E_{CG4}$, $E_{CG5}$, and $E_{CG6}$ of some of the control gates of blocks BLK0, BLK1, and BLK3, and edges $E_{OX1}$, $E_{OX2}$, $E_{OX3}$, $E_{OX4}$, $E_{OX5}$, and $E_{OX6}$ of some of dielectric materials 521 of blocks BLK0, BLK1, and BLK3.

As shown in FIG. 8, each of control gates $220_0$, $221_0$, $222_0$, and $223_0$ of block BLK0 can include an edge (e.g., edge $E_{CG2}$ of control gate $222_0$) adjacent (e.g., contacting) material 451L of dielectric structure 451 (dielectric structure 451 on the right of FIG. 8), and an edge (e.g., edge $E_{CG3}$ of control gate $222_0$) adjacent (e.g., contacting) material 424L (material 424L on the left side) of dielectric structure 424.

Each of control gates $220_1$, $221_1$, $222_1$, and $223_1$ of block BLK1 can include an edge (e.g., edge $E_{CG3}$ of control gate $222_1$) adjacent material 424L (material 424L on the right side) of dielectric structure 424, and an edge (e.g., edge $E_{CG5}$ of control gate $222_1$) adjacent material 451L (material 451L on the left side) of dielectric structure 451 (dielectric structure 451 on the right of FIG. 8). The control gates (associated with signals $WL0_2$, $WL1_2$, $WL2_2$, and $WL3_2$) of block BLK2 can also include respective edges (e.g., edge $E_{CG6}$) adjacent material 451L of dielectric structure 451 (dielectric structure 451 on the right of FIG. 8).

Similarly, materials 521 can also include respective edges (e.g., vertical edges) adjacent dielectric structures 424 and 451. For example, in block BLK0, each of dielectric materials 521 can include an edge (e.g., edge $E_{OX2}$) adjacent material 451L (material 451L on the right side) of dielectric structure 451 (dielectric structure 451 on the left of FIG. 8), and an edge (e.g., edge $E_{OX3}$) adjacent material 424L (material 424L on the left side) of dielectric structure 424. In block BLK1, each of dielectric materials 521 can include an edge (e.g., edge $E_{OX4}$) adjacent material 424L (material 424L on the right side) of dielectric structure 424, and an edge (e.g., edge $E_{OX5}$) adjacent material 451L (material 424L on the left side) of dielectric structure 451 (451 on the right of FIG. 8).

Thus, as shown in FIG. 8, material 424L (on the left side) of dielectric structure 424 can contact (e.g., contact an edge) of each of control gates $220_0$, $221_0$, $222_0$, and $223_0$ of block BLK0, and material 424L (on the right side) of dielectric structure 424 can contact each of control gates $220_1$, $221_1$, $222_1$, and $223_1$ of block BLK1. Material 424L (on the left side and right sides) of dielectric structure 424 can also contact (e.g., contact edges) of respective dielectric materials 521 of adjacent blocks (e.g., blocks BLK0 and BLK1).

As shown in FIG. 8, opposing control gates of adjacent blocks that are located on the same level of memory device 200 can be separated from each other by a distance based on (e.g., equal to) width W1 or width W2. For example, edges $E_{CG3}$ and $E_{CG4}$ of respective control gates $222_0$ and $222_1$ (which are located on the same level 507) can be separated from each other by a distance equal to the width (e.g., width W1) of dielectric structure 424 between edges $E_{CG3}$ and $E_{CG4}$. In another example, edge $E_{CG2}$ of control gate $222_0$ and edge $E_{CG1}$ of an opposing control gate (not labeled) located on level 507 can be separated from each other by a distance equal to the width (e.g., width W2) of dielectric structure 451 between edges $E_{CG1}$ and $E_{CG2}$. In another example, edge $E_{CG5}$ of control gate $222_1$ and edge $E_{CG6}$ of an opposing control gate (associated with signal $WL2_2$) located on level 507 can be separated from each other by a distance equal to the width (e.g., width W2) of dielectric structure 451 between edges $E_{CG5}$ and $E_{CG6}$.

Similarly, as shown in FIG. 8, dielectric materials 521 of adjacent blocks that are located on the same level of memory device 200 can be separated from each other by a distance based on (e.g., equal to) width W1 or width W2. For example, edges $E_{OX3}$ and $E_{OX4}$ of respective dielectric materials 521 on level 504 can be separated from each other by a distance equal to the width (e.g., width W1) of dielectric structure 424 between edges $E_{OX3}$ and $E_{OX4}$. In another example, edge $E_{OX2}$ of dielectric material 521 and edge $E_{OX1}$ of an opposing dielectric material (not labeled) located on level 504 can be separated from each other by a distance equal to the width (e.g., width W2) of dielectric structure 451 between edges $E_{OX1}$ and $E_{OX2}$. In another example, edge $E_{OX5}$ of dielectric material 521 and edge $E_{OX6}$ of an opposing dielectric material (not labeled) located on level 504 can be separated from each other by a distance equal to the width (e.g., width W2) of dielectric structure 451 between edges $E_{OX5}$ and $E_{OX6}$.

As shown in FIG. 8, each of the control gates in a block can have a width in the X-direction. The width of a respective control gate can be measured from one edge of the respective control gate to another edge of the respective control gate. For example, control gate $222_0$ can have a width measured from edge $E_{CG2}$ to edge $E_{CG3}$. The width of a respective control gate in a block can also be the width of the block. The blocks of memory device 200 can have the same width. For example, each of the blocks (e.g., blocks BLK0 and BLK1) can have a width that has a range from 2 microns to 2.2 microns. Thus, each of the control gates (control gates $220_0$, $221_0$, $222_0$, and $223_0$) of memory device 200 can have width that has a range from 2 microns to 2.2 microns.

FIG. 9 shows a cross-section of a portion of memory device 200 of FIG. 8 including a portion of control gate $223_0$ and adjacent pillar 550 at memory cell 213 of memory cell string 231a, according to some embodiments described herein. Other control gates and pillars of memory cell strings of memory device 200 have similar or the same structure shown in FIG. 9. As shown in FIG. 9, control gate $223_0$ can surround pillar 550. Portions 801, 802, 803, and 804 can include shapes as shown in FIG. 9. Dielectric material 805 of pillar 550 can be surrounded by portion (e.g., part of pillar channel structure) 804. FIG. 9 shows an example where portion 804 is a hollow structure in that it surrounds dielectric material 805. Alternatively, dielectric material 805 can be omitted, such that the material of portion 804 can also occupy the location of dielectric material 805.

As shown in FIG. 9, pillar 550 can include a width W3. Width W3 can be less than width W1 (FIG. 8). As mentioned above, the elements in the drawings described herein are not scaled. Width W3 can be less than width W1 (FIG. 8). For example, width W1 can be greater than 2 times width W3 and less than 3 times width W3 (e.g., 2W3<W1<4W3).

The above description with reference to FIG. 2 through FIG. 9 describes structure of memory device 200. Some or all of the structure of memory device 200 can be formed using processes associated with the processes described below with reference to FIG. 10A and FIG. 10B through FIG. 19A and FIG. 19B.

FIG. 10A and FIG. 10B through FIG. 19A and FIG. 19B show different views of elements during processes of forming a memory device 1000, according to some embodiments described herein. For simplicity. FIG. 10A and FIG. 10B through FIG. 19A and FIG. 19B partially show portions of memory device 1000 so as not to obscure the embodiments described herein.

FIG. 10A shows a side view (e.g., cross-section) in the X-direction of memory device 1000 after dielectric materials (levels of dielectric materials) 1021 and dielectric materials (levels of dielectric materials) 1022 are alternatively formed over a substrate 1099. Substrate 1099 is similar to (e.g., can correspond to) substrate 599 (FIG. 5 and FIG. 8) of memory device 200. Dielectric materials 1021 and 1022 can be sequentially formed one material after another over substrate 1099 in an interleaved fashion, such that dielectric materials 1021 can be interleaved with dielectric materials 1022.

FIG. 10B shows a top view of a portion (e.g., in the X-Y plane) of memory device 200 taken along line 10B-10B of FIG. 10A. The side view (in the X-Z direction) of memory device 1000 shown in FIG. 10A is taken along line (e.g., cross-section line) 10A-10A of FIG. 10B.

As shown in FIG. 10A, the process of forming memory device 1000 can include forming a material 1090 over substrate 1099. Material 1090 can form part of a source (e.g., associated with signal SRC) that is similar to source 290 of FIG. 5.

One skilled in the art would readily recognize that the process of forming memory device 1000 described herein with reference to FIG. 10A and FIG. 10B through FIG. 19A and FIG. 19B can include forming additional elements (not shown) in portions 1091 and 1092 (shown in dashed lines) of memory device 1000 in FIG. 10A. For example, the additional elements in portion 1091 can include select circuits similar to select circuits (e.g., source select circuits) 241'a, 244'a, 241'b, and 244'b and other elements of memory device 200 (e.g., FIG. 2. FIG. 3, and FIG. 5, FIG. 8). In another example, the additional elements in portion 1092 can include select circuits similar to select circuit (e.g., drain select circuit) 241a, 244a, 241b, and 244b and other elements of memory device 200 (e.g., FIG. 2, FIG. 3, and FIG. 5. FIG. 8). For simplicity and not to obscure the embodiments described herein, a description of the formation of such additional elements in portions 1091 and 1092 (FIG. 10A) is omitted from the description herein.

In the following description, different views of memory device 1000 in subsequent processes are based on the views of memory device 1000 of FIG. 10A and FIG. 10B and follow the same arrangement of the views (e.g., side view and top view) of FIG. 10A and FIG. 10B. For example, FIG. 11A shows a side view of a portion of memory device 1000 taken along line (e.g., cross-section line) 11A-11A of FIG. 11B. FIG. 11B shows a top view of a portion of memory device 1000 of FIG. 11A taken along line 11B-11B of FIG. 11A. For simplicity, the following description omits repeating specific views (e.g., side view and top view) and specific cross-section lines of the portion of memory device 1000 from one process to the next.

In the description herein, elements given the same numerical labels are similar or the same elements. For example, pillar 550 (FIG. 5 and FIG. 8) and pillar 550' (FIG. 12A) are similar or the same elements. In another example, control gates $220_0$, $221_0$, $222_0$, and $223_0$ (FIG. 8) and control gates $220'_0$, $221'_0$, $222'_0$, and $223'_0$ (FIG. 17A) are similar or the same elements. In another example, control gates $220_1$, $221_1$, $222_1$, and $223_1$ (FIG. 8) and control gates $220'_1$, $221'_1$, $222'_1$, and $223'_1$ (FIG. 17A) are similar or the same elements. Thus, for simplicity, the detailed description of similar or the same elements may not be repeated.

FIG. 11A and FIG. 11B show different views of memory device 1000 after openings (e.g., holes) 1150 are formed through dielectric materials 1021 and 1022. Forming openings 1150 can include removing (e.g., etching) a portion of dielectric materials 1021 and 1022 at the locations of openings 1150.

Figure 12B:
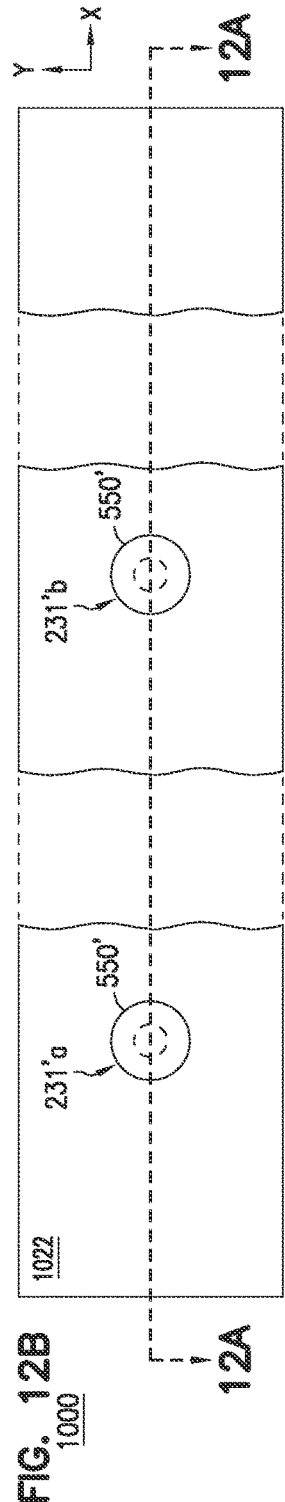
Figure 12A:
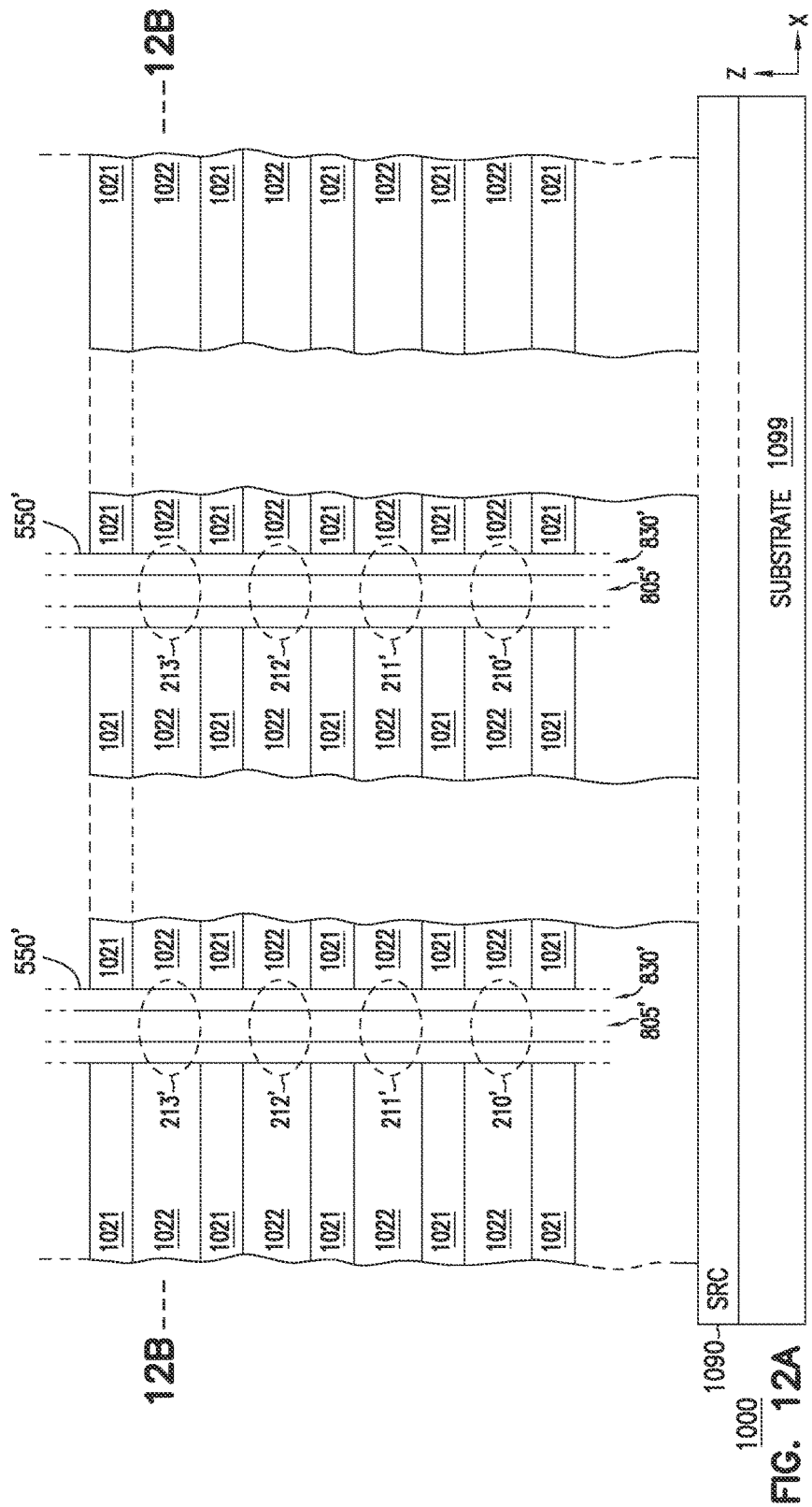

FIG. 12A and FIG. 12B show different views of memory device 1000 after pillars 550' and memory cells 210',211'. 212', and 213' of memory cell strings 231'a and 231'b are formed. Forming pillars 550' can include forming a structure 830' and a dielectric material 805' in respective openings 1150 (labeled in FIG. 11A). Pillars 550' are similar to (e.g., can correspond to) pillars 550 of FIG. 8. Structure 830' and dielectric material 805' are similar to (e.g., can correspond to) structure 830 and dielectric material 805, respectively, of FIG. 8. For simplicity, detail of structure 830' of each pillar 550' is omitted from FIG. 12A and FIG. 12B.

Structure 830' in FIG. 12A can form part of memory cells 210'. 211',212', and 213' of a respective memory cell string of memory device 1000 of FIG. 12A. Memory cells 210'. 211',212', and 213' of FIG. 12B are similar to (e.g., can correspond to) memory cells 210, 211, 212, and 213, respectively, of memory device 200 of FIG. 8. Memory cell strings 231'*a* and 231'*b* of memory device 1000 are similar to (e.g., can correspond to) memory cell strings 231*a* and 231*b* of memory device 200 of FIG. 8.

In FIG. 12A, a level (e.g., a layer) of dielectric material 1022 (or alternatively, two adjacent levels that include a level of dielectric material 1021 and a level of dielectric material 1022) can be called a tier of memory device 1000. As shown in FIG. 12A, the tiers of memory device 800 can be located (e.g., stacked) one over another in the Z-direction over substrate 1099, such that two adjacent tiers can be separated from each other by a respective level (e.g., layer) of dielectric material (e.g., silicon dioxide) 1021. FIG. 12A shows an example of a specific number of tiers (e.g., four tiers) that can be subsequently processed to form four corresponding control gates and four levels of memory cells in each block of memory device 1000. However, memory device 1000 can include up to (or more than) a hundred tiers in FIG. 12A that can be processed to form up to (or more than) a hundred tiers of corresponding control gates and levels of memory cells.

FIG. 13A, FIG. 13B, and FIG. 13C show memory device 1000 after slits (e.g., openings, trenches, or cuts) 1324 are formed. Slits 1324 can be formed to separate (e.g., divide) dielectric materials 1021 and 1022 and pillars 550' into multiple portions 1301. For simplicity, the following description describes slit 1324 of FIG. 13A and FIG. 13B. Other slits 1324 in FIG. 13C have a similar structure.

As shown in FIG. 13A and FIG. 13B, slit 1324 can be formed such that it can extend through the levels of dielectric materials 1021 and 1022. Slit 1324 can include a width W1 in the X-direction. Slit 1324 can include sidewalls 1324A and 1324B opposite from each other in the X-direction. Sidewalls 1324A and 1324B are vertical sidewalls that can include respective portions of dielectric materials 1021 and 1022 exposed at slit 1324. Thus, width W1 is also the distance between respective portions (e.g., vertical edges) of dielectric materials 1021 located in the same level (in the Z-direction) and exposed at respective sidewall 1324A and 1324B.

Slit 1324 can be formed to separate (e.g., divide) dielectric materials 1021 and 1022, and pillars 550' of respective memory cell strings into multiple portions. For example, as shown in FIG. 13A and FIG. 13B, slit 1324 can separate dielectric materials 1021 and 1022 and pillar 550' of memory cell strings 231'*a* and 231'*b* into portions 1301 portions on the left and right of slit 1324.

Figure 14C:
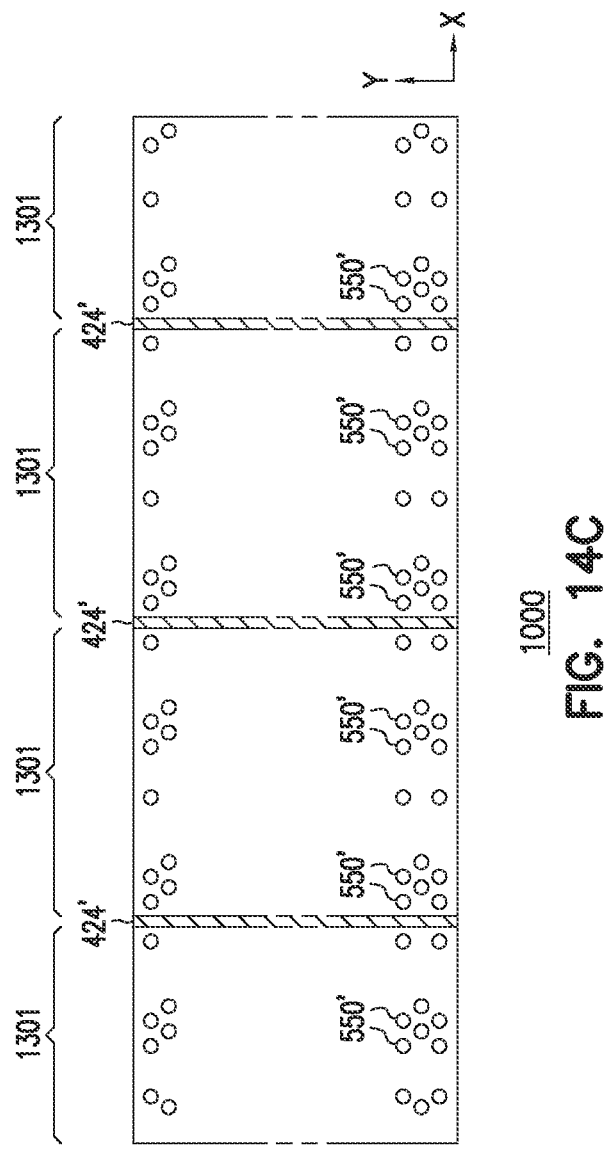

FIG. 14A, FIG. 14B, and FIG. 14C show memory device 1000 after dielectric structure 424' is formed in slits 1324 (labeled in FIG. 13A). Forming dielectric structures 424' can include forming a material (e.g., a liner) 424'L in slits 1324 (e.g., on sidewalls of slit 1324) and then forming a material (e.g., polysilicon) 424'P between materials 424'L. Dielectric structure 424' and materials 424'L and 424'P are similar to (e.g., can correspond to) dielectric structure 424 and materials 424L and 424P, respectively, of memory device 200 described above with reference to FIG. 8 and FIG. 4C. In alternative processes of forming dielectric structures 424' of memory device 1000 in FIG. 14A and FIG. 14B, the process of forming material 424'P can be omitted. Thus, in an alternative structure of memory device 1000, material 424'L can be formed to also occupy the location of material 424'P, such that material (e.g., silicon dioxide) 424'L can fill slits 1324.

Thus, as shown in FIG. 14A. FIG. 14B, and FIG. 14C, forming dielectric structure 424' can separate (e.g., divide) dielectric materials 1021 and 1022 into multiple portions 1301 in the X-direction. Each of the multiple portions 1301 can include respective portion of the pillars 550' of memory cell strings of memory device 1000.

FIG. 15A, FIG. 15B, and FIG. 15C show memory device 1000 after slits (e.g., openings, trenches, or cuts) 1551 are formed. Slits 1551 can be formed to interleave with slits 1324 (labeled in FIG. 13C) where dielectric structures 424' were formed, such that dielectric materials 1021 and 1022 and pillars 550' in portions 1301 (labeled in FIG. 13C) can be separated (e.g., divided) into multiple blocks BLK. Blocks BLK can form respective blocks (e.g., blocks BLK, BLK0, BLK1, and BLK2) of memory device 1000. For simplicity, the following description describes slits 1551 of FIG. 15A and FIG. 15B. Other slits 1551 in FIG. 15C have a similar structure.

As shown in FIG. 15A, slit 1551 can be formed such that it can extend through the levels of dielectric materials 1021 and 1022. Slit 1551 can include a width W2 in the X-direction. Slit 1551 can include sidewalls 1551A and 1551B opposite from each other in the X-direction. As shown in FIG. 15A, sidewalls 1551A and 1551B are vertical sidewalls that can include respective portions of dielectric materials 1021 and 1022 exposed at slit 1551. Thus, width W2 is also the distance between respective portions (e.g., vertical edges) of dielectric materials 1021 located in the same level (in the Z-direction) and exposed at respective sidewall 1551A and 1551B.

As shown in FIG. 15A, slit 1551 (on the left of FIG. 15A) can separate dielectric materials 1021 and 1022 and the pillars 550' of portion 1301 (labeled in FIG. 13C) into blocks BLK and BLK0. Slit 1551 (on the right of FIG. 15A) can separate dielectric materials 1021 and 1022 and the pillars 550' into blocks BLK1 and BLK2.

Slit 1551 can include a width W2 in the X-direction. Width W2 is also the distance between the edges (e.g., vertical edges) of respective portions of dielectric materials 1021 located in the same level (in the Z-direction) at respective sidewall 1551A and 1551B. Width W2 can be greater than width W1.

The following descriptions associated with FIG. 16A, FIG. 16B, FIG. 17A and FIG. 17B involve processes that include removing and then replacing the levels of dielectric materials (e.g., silicon nitride) 1022 with respective levels of materials to form control gates in respective tiers in memory device 1000.

FIG. 16A and FIG. 16B show memory device 1000 after dielectric materials 1022 are removed (e.g., exhumed) from locations 1522. Locations 1522 in FIG. 16A are voids (empty spaces) that were occupied by dielectric materials 1022 in FIG. 15A. In subsequent processes, materials can be formed in locations 1522 to form respective control gates of memory device 1000.

As shown in FIG. 16A, each pillar 550' can include portions 550'W exposed at respective locations 1522. Each portion 550'W can be part of a vertical sidewall of a respective pillar 550. Each portion 550'W can extend in the Z-direction between two adjacent levels of dielectric materials 1021 that are also exposed at a respective location 1522.

As shown in FIG. 16A, dielectric structure 424' can include portions 424'W exposed at respective locations 1522. Each portion 424'W can be part of a vertical sidewall of dielectric structure 424'. Each portion 424'W can extend in the Z-direction between two adjacent levels of dielectric materials 1021 that are also exposed at a respective location 1522.

FIG. 17A and FIG. 17B show memory device 1000 after formation of control gates $220'_0$, $221'_0$, $222'_0$, and $223'_0$ (in block BLK0) and control gates $220'_1$, $221'_1$, $222'_1$, and $223'_1$ (in block BLK1). Control gates $220'_0$, $221'_0$, $222'_0$, and $223'_0$ in block BLK0, and control gates $220'_1$, $221'_1$, $222'_1$, and $223'_1$ in block BLK1 are similar to (e.g., can correspond to) control gates $220_0$, $221_0$, $222_0$, and $223_0$ in block BLK0, and control gates $220$, $221_1$, $222_1$, and $223_1$ in block BLK1, respectively, of memory device 200 (e.g., FIG. 8).

Forming control gates $220'_0$, $221'_0$, $222'_0$, and $223'_0$ (in block BLK0) and control gates $220'_1$, $221'_1$, $222'_1$, and $223'_1$ (in block BLK1) can include forming a liner structure 1752 and a material 1754 in each of these control gates. Liner structure 1752 can before material 1754 is formed.

Liner structure 1752 can include a single material (e.g., a single layer of material) or a combination of multiple different materials (e.g., multiple layers of different materials formed one over another). For example, line structure 1752 can include a dielectric material. The dielectric material can include a high-k dielectric material (e.g., aluminum oxide ($Al_2O_3$) or other hi-k dielectric materials. In another example, liner structure 1752 can include a combination of a dielectric material (e.g., $Al_2O_3$) and a conductive material (e.g., titanium nitride (TiN)).

Material 1754 can include a conductive material metal. For example, material 1754 can include metal (e.g., tungsten or other metal). FIG. 17A shows an example where liner structure 1752 include portions 1752V formed on respective portions (e.g., vertical edged) of dielectric materials 1021 at slits 1551. However, portions 1752V can be removed, such that portions (e.g., vertical edges) of dielectric materials 1021 can be exposed at slits 1551. In alternative processes of forming memory device 1000, the process of forming liner structure 1752 can be omitted.

Figure 18C:
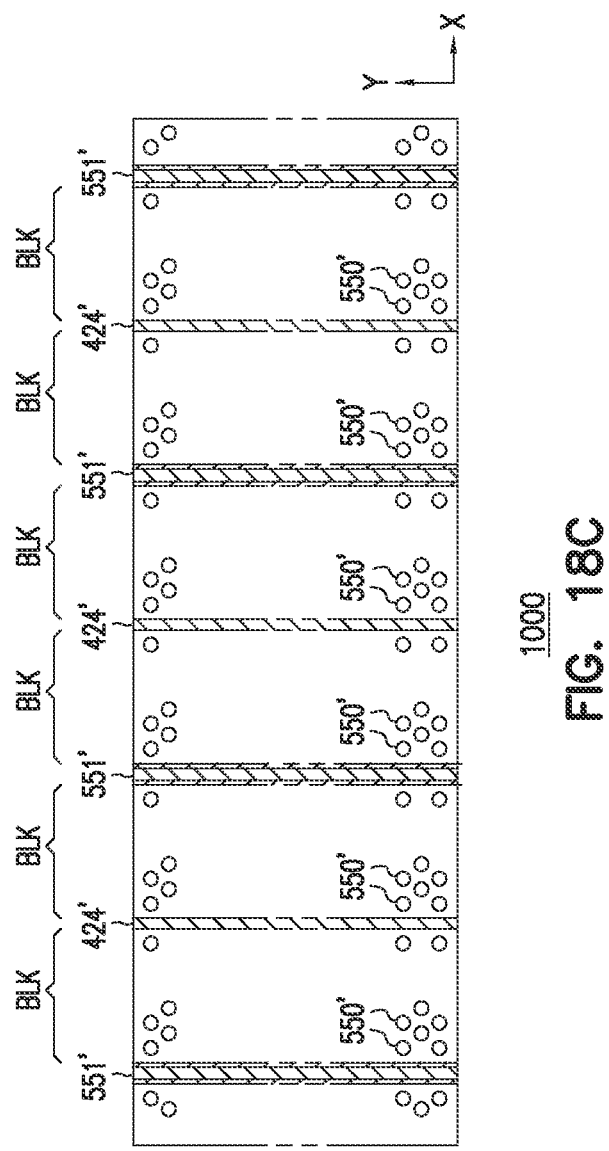

FIG. 18A, FIG. 18B, and FIG. 18C show memory device 1000 after dielectric structures 451' are formed in respective slits 1551 (labeled in FIG. 15C). As shown in FIG. 18A, forming dielectric structure 451' can include forming a material (e.g., a liner) 451'L in slit 1551 (e.g., on sidewalls of slit 1551) and then forming a material 451'P between materials 451'L. Dielectric structure 451' and materials 451'L and 451'P are similar to (e.g., can correspond to) dielectric structure 451 and materials 451L and 451P, respectively, of memory device 200 described above with reference to FIG. 6. As shown in FIG. 18A, dielectric structures 451' can electrically separate the control gates of adjacent blocks. For example, dielectric structure 451' (on the right of FIG. 18A) can separate control gates $220'_1$, $221'_1$, $222'_1$, and $223'_1$ of block BLK1 from the control gates (not labeled) of block BLK2.

Thus, as described above, dielectric structure 424' (FIG. 14A and FIG. 14C) can be formed to separate dielectric materials 1021 and 1022 and pillars 550' into multiple portions (e.g., portions 1301 in FIG. 14C). Each of the multiple portions is between two dielectric structure 424'. Each of the multiple portions includes a respective portion of the dielectric materials 1021 and 1022 and pillars 550'.

Then, dielectric structures 451' (FIG. 18C) can be formed in the multiple portions. Dielectric structures 451' are interleaved in the X-direction, such that one dielectric structure 451' can be located between two dielectric structures 424', and one dielectric structure 424' can be located between two dielectric structures 451'. As shown in FIG. 18C, dielectric structures 451' can separate the multiple portions 1301 (labeled in FIG. 14C) into blocks (e.g., blocks BLK0, BLK1, and BLK2 in FIG. 18A) of memory device 1000. As shown in FIG. 18A, two adjacent blocks (e.g., block BLK1 and BLK2) of the multiple blocks can be separated from each other by one of the dielectric structures 451'. Two adjacent blocks (e.g., block BLK0 and BLK1) of the multiple blocks can be separated from each other by one of the dielectric structures 424'.

Forming memory device 1000 as described above can provide improvements and benefits over some conventional techniques. For example, since dielectric structures 424' (FIG. 14C) are formed before dielectric structures 451' (FIG. 18C) are formed, block-bending error can be mitigated or reduced. Block-bending error may occur when the portions used to form the blocks of the memory device have a relatively high aspect ratio. The high aspect ratio may reduce the stability (e.g., weaken) the structure of such portions and can cause them to bend (e.g., bend in the X-direction). However, in memory device 1000, forming different dielectric structures at different times (e.g., dielectric structures 424' are formed in the processes associated with FIG. 14C before dielectric structures 551' in FIG. 18C are formed) can merge adjacent portions that are subsequently used to form adjacent blocks. The merge can reduce the aspect ratio of portions (e.g., portions 1301) used to form the blocks of memory device 1000. This can increase the stability (e.g., strengthen) the structures of such portions. Thus, block-bending error can be mitigated or reduced.

Moreover, in some structures of forming memory device 1000, a number of block-bending absorbing structures (e.g., dummy blocks) may be formed to reduce block-bending error. However, formation of dielectric structures 424' (which can strengthen the portions (e.g., portions 1301) that are used to form the blocks) can reduce the number of such block-bending absorbing structures (e.g., the number of dummy blocks). Therefore, the size of memory device 1000 can be relatively smaller than some conventional device, and memory cell density of memory device 1000 can be increased.

FIG. 19A and FIG. 19B through FIG. 22A and FIG. 22B show different views of elements during processes of forming staircase structures and conductive contacts (e.g., word line contacts) for the blocks of memory device 1000. For simplicity, the following description (FIG. 19A through FIG. 22B) describes processes for forming the staircase structure and conductive contacts at a portion of block BLK0 of memory device 1000. However, the staircase structure and conductive contacts of other blocks of memory device 1000 can be formed in the same processes.

FIG. 19A and FIG. 19B show memory device 1000 including a portion of block BLK0 at a memory array 201' and a staircase region 454'. Memory array 201' and staircase region 454' are similar to (e.g., can correspond to) memory array 201' and staircase region 454', respectively, of memory device 200 (e.g., FIG. 4).

FIG. 19A shows a side view (e.g., a cross-section) of a portion of block BLK0 in the Y-Z direction. The Y-direction is parallel to the lengths of dielectric structures 424' and 451' (FIG. 18C) FIG. 19B shows a top view of a portion of block BLK0 taken along line (e.g., cross-section line) 19A-19A of FIG. 19B. The portions of memory device 1000 in FIG. 20A and FIG. 20B, FIG. 21A and FIG. 21B, and FIG. 22A and FIG. 22B, are arranged in the same views (e.g., top view and side view, respectively).

FIG. 19A and FIG. 19B show memory device 1000 after the pillars (e.g., pillar 550') and the memory cells (e.g., memory cells 210', 211', 212', and 213') of memory device 1000 are formed in memory array 201. The pillars and the memory cells of memory device 1000 can be formed in the processes described above with reference to FIG. 12A and FIG. 12B.

As shown in FIG. 19A, pillar 550' is formed through the control gates (associated with signals $WL0_0$, $WL1_0$, $WL2_0$, and $WL3_0$) and dielectric materials 1021. For simplicity, FIG. 19A and FIG. 19B (and FIG. 20A through FIG. 22B) omit other elements (e.g., drain and source select lines and select gates) of memory device 1000 that are located below and above the control gates. Further, FIG. 19A shows memory device 1000 having four control gates (associated with four corresponding signals $WL0_0$, $WL1_0$, $WL2_0$, and $WL3_0$) as an example. However, memory device 100 can include numerous control gates (e.g., M control gates, where M can be a number greater than four, for example, M can be up to one hundred or more).

FIG. 20A and FIG. 20B show different views of memory device 1000 after staircase structure $420'_0$ is formed. Forming staircase structure $420'_0$ can include removing part of each of the control gates and dielectric materials 1021, such that the remaining part of the control gates and dielectric materials 1021 can form staircase structure $420'_0$. A shown in FIG. 20A, staircase structure $420'_0$ can include (e.g., can be formed from) portions (e.g., end portions) of the control gates and portions (e.g., end portions) of dielectric materials 1021. Thus, staircase structure $420'_0$ (FIG. 20A) can be formed after memory cells 210',211',212', and 213' (FIG. 19A) are formed. The processes associated with FIG. 20A and FIG. 20B can include forming a material (e.g., dielectric material (e.g., silicon dioxide)) 2081, which can be formed after staircase structure $420'_0$ is formed. The same processes associated with FIG. 20A and FIG. 20B can also form a single staircase structure in each of the blocks of memory device 1000 (like blocks BLK1, BLK2, and BLK3 of memory device 200 of FIG. 4).

FIG. 21A and FIG. 21B show different views of memory device 1000 after openings (e.g., holes) 720' are formed through material 2081. Forming openings 720' can include removing (e.g., etching) a portion of material 2081 at the locations of openings 720'. Openings 720' are similar to (e.g., can correspond to) openings 720 of memory device 200 of FIG. 7.

FIG. 22A and FIG. 22B show different views of memory device 1000 after dielectric materials (e.g., dielectric liners) 731' and conductive contacts 765' are formed. Dielectric materials 731' can be formed on sidewalls of respective openings 720'. Conductive contacts 765' can be formed after dielectric materials 731' are formed. Dielectric materials 731' and conductive contacts 765' are similar to (e.g., can correspond to) dielectric materials 731 and conductive contacts 765, respectively, of memory device 200 of FIG. 7.

The processes of forming memory device 1000 described above with reference to FIG. 10A and FIG. 10B through FIG. 22A and FIG. 22B can include other processes to form a complete memory device (e.g., memory device 1000). Such processes are omitted from the above description so as not to obscure the subject matter described herein.

Thus, as shown in FIG. 20A, a single staircase structure (e.g., staircase structure $420'_0$) can be formed in block BLK0, such that staircase structure $420'_0$ can include portions (e.g., end portions) from each of the control gates (e.g., from all of the control gates) located along the pillars (e.g., pillar 550'). For example, if block BLK0 has M control gates (e.g., located on M respective tiers of control gates) of block BLK0, then the single staircase structure (e.g., staircase structure $420'_0$) can be formed from respective portions of the M control gates.

Alternatively, multiple staircase structures (e.g., a multiple of staircase structure $420'_0$) can be formed in block BLK0, such that the multiple staircase structures can be stacked one over another. In the multiple staircase structures (e.g., stacked staircase structure), each staircase structure of the multiple staircase structures can be formed from a portion (fewer than all) of M control gates of block BLK0. For example, end portions from part of M control gates (e.g., bottom half of M control gates) can form a bottom staircase structure of block BLK0, and end portions from another part of M control gates (e.g., top half of M control gates) can form a top staircase structure of block BLK0 and can be stacked over the bottom staircase structure. Thus, multiple staircase structures (instead of a single staircase structure) can be formed in block BLK0.

However, as shown in FIG. 22A, forming a single staircase structure (e.g., staircase structure $420'_0$) in block BLK0 (and other blocks of memory device 1000) can be more advantageous (e.g., lower cost and process friendly) in comparison with the multiple staircase structures (e.g., stacked staircase structures) discussed above. Further, forming a single staircase structure in a block as described above can improve process margins that can lead to higher yield and relatively lower costs.

The illustrations of apparatuses (e.g., memory devices 100, 200 and 1000) and methods (e.g., method of forming memory device 1000) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 1000) or a system (e.g., a computer, a cellular phone, or other electronic systems) that includes a device such as any of memory devices 100, 200, and 1000.

Any of the components described above with reference to FIG. 1 through FIG. 22B can be implemented in a number of ways, including simulation via software. Thus, apparatuses. e.g., memory devices 100, 200, and 1000, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, and 1000 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 22B include apparatuses and methods of forming the apparatuses. One of the apparatuses includes levels of conductive materials interleaved with levels of dielectric materials; memory cell strings including respective pillars extending through the levels of conductive materials and the levels of dielectric materials; a first dielectric structure formed in a rust slit through the levels of conductive materials and the levels of dielectric materials; a second dielectric structure formed in a second slit through the levels of conductive materials and the levels of dielectric materials; the first and second dielectric structures separating the levels of conductive materials, the levels of dielectric materials, and the pillars into separate portions; and the first and second dielectric structures having different widths. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, the terms "first", "second", and "third." etc. are used merely as labels, and are not intended to impose numerical requirements on their objects.

In the detailed description and the claims, a list of items joined by the term "at least one of" can mean any combination of the listed items. For example, if items A and B are listed, then the phrase "at least one of A and B" means A only; B only; or A and B. In another example, if items A, B. and C are listed, then the phrase "at least one of A, B and C" means A only; B only; C only; A and B (excluding C); A and C (excluding B); B and C (excluding A); or all of A, B. and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A. B. and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   levels of conductive materials interleaved with levels of dielectric materials;
   memory cell strings including respective pillars extending through the levels of conductive materials and the levels of dielectric materials;
   a first dielectric structure formed in a first slit through the levels of conductive materials and the levels of dielectric materials;
   a second dielectric structure formed in a second slit through the levels of conductive materials and the levels of dielectric materials; and
   the first dielectric structure and the second dielectric structure separating the levels of conductive materials, the levels of dielectric materials, and the pillars into a first portion, a second portion, and a third portion, the first portion including first control gates associated with first memory cell strings of the memory cell strings, the first second including second control gates associated with second memory cell strings of the memory cell strings, the third portion including third control gates associated with third memory cell strings of the memory cell strings, wherein the first memory cell strings are included in a first block of memory cells, the second memory cell strings are included in a second block of memory cells, the third memory cell strings are included in a third block of memory cells, the first dielectric structure is between the first and second blocks, the second dielectric structure is between the second and third blocks, and wherein,
   the first dielectric structure is between the first and second portions and includes a first width, and
   the second dielectric structure is between the second and third portions and includes a second width, and the first width is less than the second width.

2. The apparatus of claim 1, wherein the first dielectric structure includes a dielectric material contacting the levels of dielectric materials in the first portion and the levels of dielectric materials in the second portion.

3. The apparatus of claim 2, wherein the dielectric material of the first dielectric structure and the levels of dielectric materials include a same material.

4. The apparatus of claim 2, wherein the dielectric material of the first dielectric structure include silicon dioxide, and the levels of dielectric materials include silicon dioxide.

5. The apparatus of claim 4, wherein the second dielectric structure includes:
   a first dielectric portion contacting the levels of conductive materials in the second portion;
   a second dielectric portion contacting the levels of conductive materials in the third portion; and
   a third material between the first and second dielectric portions.

6. The apparatus of claim 5, wherein the first and second dielectric portions of the second dielectric structure include a same material.

7. The apparatus of claim 6, wherein the third material of the second dielectric structure includes polysilicon.

8. The apparatus of claim 1, wherein the pillars are arranged in rows parallel to a length of the first dielectric structure, and wherein:

the first portion includes a first number of the rows of pillars;

the second portion includes a second number of the rows of pillars;

the third portion includes a third number of the rows of pillars; and the first number of the rows of pillars, the second number of the rows of pillars, and the third number of the rows of pillars are equal.

9. The apparatus of claim 8, wherein the first number of the rows of pillars is 16.

10. The apparatus of claim 1, further comprising:

a single staircase structure formed from the levels of conductive materials in the first portion;

a single staircase structure formed the levels of conductive materials in the second portion; and a single staircase structure formed from the levels of conductive materials in the third portion.

11. An apparatus comprising:

a first block including first memory cells and a first group of control gates for the first memory cells, and first dielectric materials interleaved with the first group of control gates;

a second block including second memory cells and a second group of control gates for the second memory cells, and second dielectric materials interleaved with the second group of control gates;

a third block including third memory cells and a third group of control gates for the third memory cells, and third dielectric materials interleaved with the third group of control gates;

a first dielectric structure between the first and second blocks and electrically separating the first group of control gates from the second group of control gates; and a second dielectric structure between the second and third blocks and electrically separating the second group of control gates from the third group of control gates, wherein, the first dielectric materials of the first block include a first dielectric material including a first edge adjacent the first dielectric structure, the second dielectric materials of the second block include a second dielectric material including a second edge adjacent the first dielectric structure, and a third edge adjacent the second dielectric structure, the third dielectric materials of the third block include a third dielectric material including a fourth edge adjacent the second dielectric structure, wherein the first, second, and third dielectric materials are located on a same level of the apparatus, and a distance between the first and second edges is less than a distance between the third and fourth edges.

12. The apparatus of claim 11, wherein the first dielectric structure includes a width less than a width of the second dielectric structure.

13. The apparatus of claim 11, further comprising:

a fourth block including fourth memory cells and a fourth group of control gates for the fourth memory cells, and fourth dielectric materials interleaved with the fourth group of control gates; and a third dielectric structure between the third and fourth blocks and electrically separating the third group of control gates from the fourth group of control gates, wherein, the third dielectric material includes a fifth edge adjacent the third dielectric structure, and the fourth dielectric materials of the fourth block include a fourth dielectric material located on the same level as the first, second, and third dielectric materials, the fourth dielectric material including a sixth edge adjacent the third dielectric structure, and a distance between the fifth and sixth edges is less than the distance between the third and fourth edges.

14. The apparatus of claim 11, wherein:

the first block includes first conductive regions electrically separated from each other and located over the first group of control gates;

the second block includes second conductive regions electrically separated from each other and located over the second group of control gates;

the third block includes third conductive regions electrically separated from each other and located over the third group of control gates; and the first, second, and third conductive regions are located on a same level of the apparatus and include respective lengths parallel to lengths of the first and second dielectric structures.

15. An apparatus comprising:

a first block including first memory cells and a first group of control gates for the first memory cells;

a second block including second memory cells and a second group control gates for the second memory cells;

a third block including third memory cells and a third group of control gates for the third memory cells;

a first dielectric structure between the first and second blocks and electrically separating the first group of control gates of the first block from the second group of control gates of the second block; and a second dielectric structure between the second and third blocks and electrically separating the second group of control gates of the second block from the third group of control gates of the third block, wherein, the first group of control gates of the first block includes a first control gate including a first edge adjacent the first dielectric structure, the second group of control gates of the second block includes a second control gate including a second edge adjacent the first dielectric structure, and a third edge adjacent the second dielectric structure, the third group of control gates of the third block includes a third control gate including a fourth edge adjacent the second dielectric structure, wherein the first, second, and third control gates are located on a same level of the apparatus, and a distance between the first and second edges is less than a distance between the third and fourth edges.

16. The apparatus of claim 15, further comprising:

a fourth block including fourth memory cells and a fourth group of control gates for the fourth memory cells; and a third dielectric structure between the third and fourth blocks and electrically separating the third group of control gates from the fourth group of control gates, wherein, the third control gate includes a fifth edge adjacent the third dielectric structure, and the fourth group of control gates includes a fourth control gate located on the same level as the first, second, and third control gate, the fourth control gate including a sixth edge adjacent the third dielectric structure, and a distance between the fifth and sixth edges is less than the distance between the third and fourth edges.

17. The apparatus of claim 15, further comprising:
a single staircase structure formed from the first group of control gates;
a single staircase structure formed from the second group of control gates; and
a single staircase structure formed from the third group of control gates.

18. The apparatus of claim 15, wherein:
the first block includes first conductive regions electrically separated from each other and located over the first group of control gates, the first conductive regions forming part of respective select lines of the first block;
the second block includes second conductive regions electrically separated from each other and located over the second group of control gates, the second conductive regions forming part of respective select lines of the second block; and
the third block includes third conductive regions electrically separated from each other and located over the third group of control gates, the third conductive regions forming part of respective select lines of the third block.

\* \* \* \* \*